(12) United States Patent
Yamada

(10) Patent No.: US 8,599,121 B2
(45) Date of Patent: *Dec. 3, 2013

(54) ACTIVE MATRIX SUBSTRATE AND DRIVE CIRCUIT THEREOF

(75) Inventor: Takaharu Yamada, Matsuzaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/564,201

(22) Filed: Aug. 1, 2012

(65) Prior Publication Data

US 2013/0038590 A1   Feb. 14, 2013

Related U.S. Application Data

(62) Division of application No. 11/631,652, filed as application No. PCT/JP2005/011632 on Jun. 24, 2005, now Pat. No. 8,264,434.

(30) Foreign Application Priority Data

Jul. 14, 2004   (JP) .................................. 2004-207738

(51) Int. Cl.
   *G09G 3/36*   (2006.01)
(52) U.S. Cl.
   USPC .................. 345/87; 345/92; 345/204; 349/38
(58) Field of Classification Search
   USPC .......................................... 345/87–103, 204
   See application file for complete search history.

(56) References Cited

U.S. PATENT DOCUMENTS

| | | | |
|---|---|---|---|
| 6,028,650 A | 2/2000 | Kuroha et al. | |
| 6,249,325 B1 * | 6/2001 | Ohkawara et al. | 349/38 |
| 6,359,607 B1 | 3/2002 | Yanagi et al. | |
| 6,501,466 B1 | 12/2002 | Yamagishi et al. | |
| 6,504,585 B2 * | 1/2003 | Ohkawara et al. | 349/38 |
| 6,646,691 B1 | 11/2003 | Watanabe et al. | |
| 6,831,620 B1 * | 12/2004 | Nishikubo et al. | 345/87 |
| 2002/0018156 A1 | 2/2002 | Lee et al. | |
| 2002/0154084 A1 | 10/2002 | Tanaka et al. | |
| 2003/0098935 A1 | 5/2003 | Lee et al. | |

FOREIGN PATENT DOCUMENTS

| | | |
|---|---|---|
| JP | 05-232509 | 9/1993 |
| JP | 05-232512 | 9/1993 |
| JP | 11-084428 | 3/1999 |
| JP | 2000-147539 | 5/2000 |
| JP | 2001-033758 | 2/2001 |
| JP | 2001-147659 | 5/2001 |
| JP | 2002-072989 | 3/2002 |
| JP | 2002-156923 | 5/2002 |
| JP | 2002-202493 | 7/2002 |

* cited by examiner

*Primary Examiner* — Viet Pham
(74) *Attorney, Agent, or Firm* — Harness, Dickey & Pierce, P.L.C.

(57) ABSTRACT

An active matrix substrate used in a display device or the like capable of making substantially uniform the level shift generated in the pixel potential caused by the distribution of resistance and capacity in each signal line is disclosed. On the TFT substrate which is an active matrix substrate including a common electrode line formed parallel to the scan signal line, in order to eliminate non-uniformity of the level shift of the pixel potential generated at the scan signal fall, each pixel circuit is formed so that the capacity between the scan signal line and the pixel electrode becomes greater as electrically going farther from the scan signal line drive circuit and going farther from the common electrode line drive circuit. Embodiments can be applied especially to an active matrix substrate used in a liquid crystal display device, an EL display device, and the like.

16 Claims, 17 Drawing Sheets

ACTIVE MATRIX SUBSTRATE AND DRIVE CIRCUIT THEREOF

CROSS-REFERENCE TO RELATED APPLICATIONS

This application is a divisional of and claims priority under 35 U.S.C. §§120/121 to U.S. patent application Ser. No. 11/631,652, filed on Jan. 5, 2007 now U.S. Pat. No. 8,264,434, which is a National Stage of International Application No. PCT/JP05/11632, filed on Jun. 24, 2005, and which claims the benefit of Japanese Patent Application No. 2004-207738, filed on Jul. 14, 2004. The disclosures of each of the above applications are incorporated herein by reference.

TECHNICAL FIELD

The present invention relates to active matrix substrates and drive circuits for the substrates used in matrix type liquid crystal display devices, EL (Electroluminescence) display devices and so on. More specifically, the present invention relates to an active matrix substrate formed with a plurality of data signal lines and a plurality of scanning lines to cross with each other in a grid pattern and a matrix of pixel circuits each including a switching element provided by a field-effect transistor such as a thin-film transistor and a voltage holding capacitor. The invention also relates to a drive circuit for the substrate.

BACKGROUND ART

Active matrix substrates are used widely in active matrix type display devices such as liquid crystal display devices and EL display devices, as well as in a variety of active matrix type sensors and other products. In particular, special attentions are being paid to liquid crystal display devices in which each display pixel is provided with a switching element such as a thin-film transistor (hereinafter abbreviated as TFT) which is a type of field-effect transistors, since these display devices are capable of displaying excellent images without crosstalk between mutually adjacent display pixels even if there is a large number of display pixels.

Such an active matrix type liquid crystal display device primarily includes a liquid crystal display panel and a drive circuit for the panel. The liquid crystal display panel includes a pair of electrode substrates sandwiching a liquid crystal layer. Each electrode substrate has its outer surface covered by a polarizer.

Of the pair of electrode substrates, one is an active matrix substrate called TFT substrate. The TFT substrate includes an insulating substrate made of glass for example, formed with a plurality of data signal lines and a plurality of scanning signal lines crossing with each other in a grid pattern and in addition, a plurality of common electrode lines are formed to extend in parallel to the scanning signal lines. Further, correspondingly to each of the intersections made by the data signal lines and the scanning signal lines, a matrix of pixel circuits are formed. Each pixel circuit includes a pixel electrode for a corresponding pixel that serves to form images to be displayed, pixel capacities formed by the pixel electrode and other elements such as an opposed electrode which will be described later, and a TFT which serves as a switching element. The other electrode substrate, called opposed substrate, is provided by a transparent insulating substrate made of glass for example, having its entire surface laminated with a layer of opposed electrode and then with an alignment film.

The active matrix type liquid crystal display device includes, as a drive circuit for the liquid crystal display panel configured as the above, a scanning signal line drive circuit connected with the scanning signal lines, a data signal line drive circuit connected with the data signal lines, a common electrode line drive circuit connected with the common electrode lines, and an opposed electrode drive circuit connected with the opposed electrode.

The data signal line drive circuit generates, based on image signals received from an outside signal-source for example, a plurality of data signals successively in the form of analog voltage representing pixel values in each horizontal scanning line of the image to be displayed in the liquid crystal display panel, and applies these data signals respectively to the data signal lines in the liquid crystal display panel. The scanning signal line drive circuit selects the scanning signal lines in the liquid crystal display panel sequentially for each horizontal scanning period, and applies an active scanning signal (a voltage for turning ON the TFTs in the pixel circuit) to the selected scanning signal line, in each frame period (each vertical scanning period) for displaying an image on the liquid crystal display panel. The common electrode line drive circuit and the opposed electrode drive circuit apply signals to the common electrode lines and the opposed electrode respectively; these signals give electric potentials that serve as baseline voltages for voltages to be applied to the liquid crystal layer of the liquid crystal display panel.

As described above, the data signal lines are supplied with respective data signals, the scanning signal lines are supplied with respective scanning signals, whereby the pixel electrode in each pixel circuit of the liquid crystal display panel is supplied with a voltage representing the value of the pixel for the image to be displayed, with the potential at the opposed electrode serving as the baseline voltage, and the supplied voltage is held at the pixel capacity in each pixel circuit. Thus, a voltage which equals to the potential difference between each pixel electrode and the opposed electrode is applied to the liquid crystal layer. By controlling optical transmittance based on the applied voltage, the liquid crystal display panel displays an image represented by the image signals received from e.g. an outside signal-source.

FIG. 19 is a circuit diagram which shows a configuration of a pixel circuit in a TFT substrate serving as an active matrix substrate used in a liquid crystal display device as described above. A pixel circuit P(i, j) corresponds to one of the intersections made by the data signal lines and the scanning signal lines, and includes: a TFT 102 which has a source electrode connected with a data signal line S(i) passing the corresponding intersection, and a gate electrode connected with a scanning signal line G(j) passing the same intersection; and a pixel electrode 103 connected with a drain electrode of the TFT 102. The pixel electrode 103 and the opposed electrode form a liquid-crystal capacity Clc. The pixel electrode 103 and a common electrode line CS(j) provided along the scanning signal line G(j) form a common-electrode capacity (may also called "supplemental capacity") Ccs, and the pixel electrode 103 and the scanning signal line G(j) form a parasitic capacity Cgd.

Hereinafter, reference will be made to FIG. 4-(A) through FIG. 4-(D), FIG. 9 and FIG. 19, to describe a conventional method of driving the above-described TFT substrate in a liquid crystal display device. As a matter of well known fact, liquid crystal displays need AC driving in order to reduce burning images on the screen and display deterioration. The following description of a conventional driving method will assume that a frame-inversion driving method which is a type of AC driving is used.

FIG. 4-(A) through 4-(D) are voltage waveform charts of various voltage signals Vg(j), Vs(i), Vcs, Vcom in the TFT substrate and a waveform of a potential of the pixel electrode (hereinafter may also called "pixel potential") Vd (i, j) in two consecutive frame periods, i.e. a first frame period TF1 and a second frame period TF2. As shown in FIG. 4-(A), in the first frame period TF1, a voltage serving as a scanning signal (hereinafter called "scanning voltage") Vgh is applied from the scanning signal line drive circuit to the gate electrode g (i, j) of the TFT 102 in a pixel circuit P(i, j). This turns ON the TFT 102 (into a conductive state), where a voltage serving as a data signal (hereinafter called "data signal voltage") Vsp applied from the data signal line drive circuit to the data signal line S(i) is supplied to the pixel electrode 103 via the source electrode and the drain electrode of the TFT 102. Thus, the data signal voltage Vsp becomes a positive-polarity voltage with respect to the opposed-electrode potential Vcom (=common electrode potential Vcs), and is written to a pixel capacity Cpix which is formed by the pixel electrode 103 and other electrodes. As shown in FIG. 4-(D), the pixel electrode 103 holds the pixel potential Vdp until a scanning voltage Vgh is applied in the next frame period, i.e. the second frame period TF2. As shown in FIG. 19, the pixel capacity Cpix for holding the pixel potential Vdp is made of the liquid-crystal capacity Clc, the common-electrode capacity Ccs and the parasitic capacity Cgd. Meanwhile, the opposed electrode is set to a predetermined opposed-electrode potential Vcom by the opposed electrode drive circuit. Therefore, the liquid crystal sandwiched between the pixel electrode and the opposed electrode makes a response in accordance with the potential difference between the pixel potential Vdp and the opposed-electrode potential Vcom, achieving a display of the image.

Likewise, as shown in FIG. 4-(A), in the second frame period TF2, upon application of the scanning voltage Vgh from the scanning signal line drive circuit to the gate electrode g(i, j) of the TFT 102 in the pixel circuit P(i, j), the TFT 102 is turned ON, where a data signal voltage Vsn which is applied from the data signal line drive circuit to the data signal line S(i) is supplied to the pixel electrode 103 via the source electrode and the drain electrode of the TFT 102. Thus, the data signal voltage Vsn becomes a negative-polarity voltage with respect to the opposed-electrode potential Vcom (=Vcs), and is written into the pixel capacity Cpix. The pixel electrode 103 holds the pixel potential Vdn until the scanning voltage Vgh is applied in the next frame period. Thus, the liquid crystal sandwiched between the pixel electrode and the opposed electrode makes a response in accordance with the potential difference between the pixel potential Vdn and the opposed-electrode potential Vcom, achieving a display of the image, in an AC driving of a liquid crystal.

As shown in FIG. 19, a parasitic capacity Cgd is unavoidably formed between the scanning signal line G(j) and the pixel electrode 103 in each pixel circuit P(i, j) as a nature of the configuration. Therefore, as shown in FIG. 4-(D), at the time when the active scanning signal voltage, i.e. the scanning voltage Vgh falls down to the non active scanning signal voltage, i.e. the scanning voltage Vgl (represented by a time point ta in the figure), a level shift ΔVd occurs in the pixel potential Vd due to the parasitic capacity Cgd. It should be noted here that in FIG. 4-(D), the level shift of the pixel potential Vd (i, j) in the pixel circuit P(i, j) in the first frame period (in the period when a positive voltage is applied to the liquid crystal layer) TF1 (or more accurately, a level shift at a time point tb which is a time point well after the time point ta) is indicated by a symbol "ΔVdp (i, j)" whereas the level shift of the pixel potential Vd (i, j) in the pixel circuit P(i, j) in the second frame period (the period when a negative voltage is applied to the liquid crystal layer) TF2 is indicated by a symbol "ΔVdn (i, j)". However, when there is no need to specifically clarify the pixel circuit or the frame period, these level shifts will be indicated by a common symbol "ΔVd" as used in the above (The same will apply hereinafter).

The level shift ΔVd which occurs in the pixel potential Vd due to the parasitic capacity Cgd which is formed unavoidably in the TFT 102 is expressed as follows:

$$\Delta Vd = Vgpp \cdot Cgd / Cpix$$

$$Vgpp = Vgl - Vgh$$

$$Cpix = Clc + Ccs + Cgd$$

The level shift causes such problems as flickers in the displayed image and decreased quality of the displayed image. For this reason, occurrence of the level shift ΔVd as the above is not preferable for liquid crystal display devices which are supposed to achieve ever higher fineness and quality.

Meanwhile, there has been a number of methods (means) proposed for eliminating or reducing the level shift ΔVd as described above. For example, a method has been proposed in which a bias is given to the potential at the opposed electrode so that the level shift ΔVd caused by the parasitic capacity Cgd will be reduced in advance. Also, JP-A Hei 11-281957 Gazette (This corresponds to U.S. Pat. No. 6,359,607, the contents of which is incorporated herein by reference), discloses a method in which the level shift variation in the pixel potential is reduced by controlling the fall of the scanning signal. Further, JP-A 2001-33758 Gazette discloses a method in which the level shift variation in the pixel potential (electric potential of the pixel electrode) by connecting a plurality of variable power sources to the common electrode line.
[Patent Document 1] JP-A 2002-202493 Gazette
[Patent Document 2] JP-A 2001-33758 Gazette
[Patent Document 3] JP-A Hei 11-281957 Gazette
[Patent Document 4] JP-A Hei 11-84428 Gazette
[Patent Document 5] JP-A Hei 10-39328 Gazette
[Patent Document 6] JP-A Hei 5-232512 Gazette

DISCLOSURE OF THE INVENTION

Problems to be Solved by the Invention

However, in the manufacture of the TFT substrate as an active matrix substrate for use in liquid crystal display devices, it is difficult to form ideal signal lines which are free from signal propagation delay, on a transparent insulating substrate provided by glass for example. A certain degree of signal propagation delay is unavoidable.

For example, scanning signal lines formed on the TFT substrate must be treated as a distributed constant wire which has a wiring resistance, a wiring capacity, etc. This means that the signal lines have a signal propagation delay characteristic. Therefore, the voltage waveform of the scanning signal Vg(j) in a scanning signal line deforms with increasing distance from the point where the scanning signal Vg(j) is applied by the scanning signal line drive circuit (i.e. from the input end of the scanning signal Vg(j)). Hence, the absolute value |ΔVd| of the level shift ΔVd caused in the pixel potential Vd by the parasitic capacity Cgd decreases with increasing distance from the input end of the scanning signal Vg(j) in the scanning signal line.

As described, the level shift ΔVd has different values depending on the location of pixel circuit, and therefore not uniform in the screen (in the TFT substrate). Therefore, if the method of giving a bias to the potential Vcom of the opposed electrode in an attempt that the level shift ΔVd of the pixel potential Vd will be reduced in advance, it is not possible to achieve sufficient elimination of the flickers in the displayed image and display quality deterioration which are caused by the level shift ΔVd, by simply applying a uniform bias to the opposed electrode. Specifically, with increase in the screen size and in the level of fineness, non-uniformity of the level shift ΔVd grows to a level beyond the viability of the above-described method, becoming unable to provide sufficient AC driving to each liquid crystal block which corresponds to a pixel, leading to problems such as flickers in the displayed image, burning images on the screen due to DC components applied to the liquid crystal, and so on.

To this problem, Patent Document 1 (Japanese Patent Laid-Open No. 2002-202493 Gazette) discloses a liquid crystal display device in which power supply for the opposed electrode that faces the pixel electrode is provided at least at two locations, i.e. on the input end side and on the terminating end side of the scanning signal line, and opposed voltages are supplied to the above-mentioned at least two power supply sources so that the potential of the opposed electrode will increase from the input-end side toward the output-end side. However, such a configuration complicates the structure for driving the opposed electrode, and furthermore, results in increased power consumption due to the current flow between the two power supply sources for the opposed electrode.

Patent Document 2 (Japanese Patent Laid-Open No. 2001-33758 Gazette) discloses another method: Specifically, level shift variation in the pixel potential is reduced by connecting a plurality of variable power sources to the common electrode line. If this method is used, it is possible to relatively cancel the level shift, with potential variation of the electrode which is opposed to the pixel electrode. However, the method requires a plurality of variable power sources in order to drive the common electrode.

Further, Patent Document 3 (Japanese Patent Laid-Open No. Hei 11-281957 Gazette) disclose another method: Specifically, level shift variation of the pixel potential is reduced by controlling the fall of the scanning signal. If this method is to be used, a special drive circuit must be provided. Further, time for charging the pixel capacity must be reduced.

Patent Document 4 (Japanese Patent Laid-Open Hei 11-84428 Gazette (This corresponds to U.S. Pat. No. 6,249,325 and No. 6,504,585, the contents of which are incorporated herein by reference)) discloses a liquid crystal display device: Toward the goal of uniformalizing the level shift of the pixel potential, an arrangement is made so that the capacity between the gate electrode and the source electrode of the thin-film transistor (TFT) formed in the liquid crystal display panel will be smaller on the input side of the gate signal line, and greater on the side of terminating end. However, due to lack of consideration to variation in the amount of charge in e.g. the pixel capacity caused by the current flows in the TFT from the time when the gate signal starts to fall to the time when the signal completes the fall (details will be described later), it is not possible to achieve sufficient elimination of the level shift non-uniformity of the pixel potential by the disclosed arrangement alone.

As will be described later, the inventor of the present invention found that in order to eliminate the level shift non-uniformity of the pixel potential, consideration must be made to influences of the parasitic capacity between the scanning signal line and the common electrode line and influences of the signal propagation delay characteristic in the common electrode line. However, these influences are not considered in any of the conventional techniques including the technique disclosed in Patent Document 4 (Japanese Patent Laid-Open Hei 11-84428 Gazette), so the level shift non-uniformity of the pixel potential cannot be eliminated sufficiently for this reason, either. Further, Patent Document 5 (Japanese Patent Laid-Open Hei 10-39328 Gazette (This corresponds to U.S. Pat. No. 6,028,650, the content of which is incorporated herein by reference)) discloses a liquid crystal display device, in which each of the pixel electrodes is provided with a supplemental capacity arranged in such a way that its capacity value will decrease as the distance increases from the input end of the gate signal line connected with the pixel electrode. However, again, such an arrangement as the above cannot eliminate the level shift non-uniformity of the pixel potential, for the same reason.

It is therefore a first object of the present invention to provide an active matrix substrate in which the level shift caused in the pixel potential by the resistance and capacity distribution in each signal line is substantially uniformalized within the substrate. Further, a second object of the present invention is to provide a drive circuit which drives an active matrix substrate in such a way that the level shifts caused in the pixel potential by the resistance and capacity distribution in each signal line are substantially uniformalized within the substrate. Further, a third object of the present invention is to provide a display device capable of giving a high quality display of images by substantially uniformalizing the level shift in the pixel potential within the active matrix substrate thereby canceling display non-uniformity.

Means for Solving the Problems

A first aspect of the present invention provides an active matrix substrate which includes:

data signal lines each for one of data signals;

scanning signal lines crossing with the data signal lines; and a matrix of pixel circuits each corresponding to one of intersections made by the data signal lines and the scanning signal lines.

Each pixel circuit includes:

a field-effect transistor having: a source electrode connected with one of the data signal lines that passes through a corresponding one of the intersections, directly or via a pre-determined switching element and/or a capacity element; and a gate electrode connected with one of the scanning signal lines that passes through the corresponding intersection; the field-effect transistor assuming a conductive state upon application of a predetermined ON voltage while assuming a non-conductive state upon application of a predetermined OFF voltage, to the gate electrode based on the source electrode as a baseline; and a voltage holding electrode connected with a drain electrode of the field-effect transistor, providing a predetermined voltage holding capacitor.

Each pixel circuit is formed so that a value given by an equation below will be substantially equal among the pixel circuits:

$$(Vgpp \cdot Cgd + \Delta Qd)/Cpix$$

where Vgpp represents an amount of potential change at the gate electrode from a time when a gate signal, which is given to the gate electrode of the field-effect transistor via the scanning signal line, starts its transition from the ON voltage to the OFF voltage to a time when the transition is complete; Cgd represents an electrostatic capacity between the gate electrode and the drain electrode in the field-effect transistor; ΔQd represents an amount of charge which moves through the field-effect transistor to the voltage holding electrode from the time when the gate signal starts its transition from the ON voltage to the OFF voltage to the time when the transition is complete; and Cpix represents a sum of electrostatic capacities formed between the drain electrode of the field-effect transistor or the voltage holding electrode and other electrodes in each pixel circuit.

In the above-described configuration, an arrangement in order that the value given by the above-described equation will be substantially equal among the pixel circuits may be that only one setting on a parameter such as a characteristic of the TFT or one of the electrostatic capacities (various electrostatic capacities formed between the pixel electrode and other electrodes) is changed, or may be that changes are made on a selected combination of these parameters.

A second aspect of the present invention provides the active matrix substrate according to the first aspect of the present invention which further includes a common electrode line disposed for formation of predetermined electrostatic capacities between itself and the voltage holding electrodes.

The charge amount $\Delta Qd$ is determined, taking into account a parasitic capacity between the scanning signal line and the common electrode line and/or a signal propagation delay characteristic of the common electrode line.

It should be appreciated that often, the common electrode line is disposed in parallel to the scanning signal line; however, the present invention is not limited to this as long as a predetermined electrostatic capacity (an equivalent of the common-electrode capacity or the supplemental capacity) is formed between the line and the pixel electrode. Further, the common electrode line may ride on a plurality of scanning signal lines, or a plurality of data signal lines. A plurality of the common electrode lines may be provided per a pixel circuit or per a pixel electrode, or the common electrode line may be provided as a plate. The freedom in the configuration of common electrode lines as the above applies to all of the aspects to be described here below.

A third aspect of the present invention provides the active matrix substrate according to the first aspect of the present invention, wherein the electrostatic capacity Cgd in each pixel circuit is formed so that the value given by the equation $(Vgpp \cdot Cgd + \Delta Qd)/Cpix$ is substantially equal among the pixel circuits.

A fourth aspect of the present invention provides the active matrix substrate according the first aspect of the present invention, wherein one of the electrostatic capacities which are formed between the drain electrode of the field-effect transistor or the voltage holding electrode and other electrodes other than the electrostatic capacity Cgd between the gate electrode and the drain electrode of the field-effect transistor is formed in each pixel circuit so that the value given by the equation $(Vgpp \cdot Cgd + \Delta Qd)/Cpix$ is substantially equal among the pixel circuits.

A fifth aspect of the present invention provides the active matrix substrate according to the first aspect of the present invention, wherein the field-effect transistor in each pixel circuit has a channel length and a channel width so selected that the value given by the equation $(Vgpp \cdot Cgd + \Delta Qd)/Cpix$ is substantially equal among the pixel circuits.

A sixth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines.

Each pixel circuit includes:

a field-effect transistor having: a source electrode connected with one of the data signal lines that passes through a corresponding one of the intersections, directly or via a predetermined switching element and/or a capacity element; and a gate electrode connected with one of the scanning signal lines that passes through the corresponding intersection; and a voltage holding electrode connected with a drain electrode of the field-effect transistor, providing a predetermined voltage holding capacitor.

An electrostatic capacity Cgd between the gate electrode and the drain electrode in the field-effect transistor increases whereas a rate of the increase of the electrostatic capacity Cgd decreases with an increasing electrical distance from a location of signal application for driving the scanning signal line which passes through the corresponding intersection.

A seventh aspect of the present invention provides an active matrix substrate which includes:

data signal lines each for one of data signals;

scanning signal lines crossing with the data signal lines; and a matrix of pixel circuits each corresponding to one of intersections made by the data signal lines and the scanning signal lines.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor.

An area of overlap between the electrode constituting the scanning signal line that passes through the corresponding intersection and the voltage holding electrode or the drain electrode of the field-effect transistor increases whereas a rate of the increase of the area decreases with an increasing electrical distance from a location of signal application for driving the scanning signal line which passes through the corresponding intersection.

An eighth aspect of the present invention provides an active matrix substrate which includes:

data signal lines each for one of data signals;

scanning signal lines crossing with the data signal lines; and a matrix of pixel circuits each corresponding to one of intersections made by the data signal lines and the scanning signal lines.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor.

A ratio L/W between a channel length L and a channel width W in the field-effect transistor increases whereas a rate of the increase in the ratio L/W decreases with an increasing electrical distance from a location of signal application for driving the scanning signal line which passes through the corresponding intersection.

A ninth aspect of the present invention provides an active matrix substrate which includes:

data signal lines each for one of data signals;

scanning signal lines crossing with the data signal lines; and a matrix of pixel circuits each corresponding to one of intersections made by the data signal lines and the scanning signal lines;

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor.

At least one of the electrostatic capacities which are formed between the drain electrode of the field-effect transistor or the voltage holding electrode and other electrodes other than the electrostatic capacity Cgd between the gate electrode and the drain electrode of the field-effect transistor decreases while a rate of the decrease of said at least one electrostatic capacity decreases with an increasing electrical distance from a location of signal application for driving the scanning signal line which passes through the corresponding intersection.

A tenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed for formation of a predetermined electric capacity in each pixel circuit;

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

An electrostatic capacity Cgd between the gate electrode and the drain electrode in the field-effect transistor increases with an increasing electrical distance from a location where an electric potential to be supplied to the common electrode line is applied to the common electrode line.

An eleventh aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

The pixel circuits include a first, a second and a third pixel circuits, the first pixel circuit is closer to an end of the common electrode line and farther from a center of the common electrode line than the second pixel circuit. The third pixel circuit is closer to another end of the common electrode line and farther from the center of the common electrode line than the second pixel circuit, and an electrostatic capacity Cgd between the gate electrode and the drain electrode in the field-effect transistor in the second pixel circuit is greater than an electrostatic capacity Cgd between the gate electrode and the drain electrode in the field-effect transistor in both of the first and the third pixel circuits.

A twelfth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

An area of overlap between the electrode constituting the scanning signal line that passes through the corresponding intersection and the voltage holding electrode or the drain electrode of the field-effect transistor increases with an increasing electrical distance from a location where an electric potential to be supplied to the common electrode line is applied to the common electrode line.

A thirteenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection.

A voltage holding electrode connected with a drain electrode of the field-effect transistor, providing the predetermined electrostatic capacity between itself and the common electrode line.

The pixel circuits include a first, a second and a third pixel circuits, the first pixel circuit is closer to an end of the common electrode line and farther from a center of the common electrode line than the second pixel circuit. The third pixel circuit is closer to another end of the common electrode line and farther from the center of the common electrode line than the second pixel circuit, and an area of overlap between the electrode constituting the scanning signal line that passes through the corresponding intersection and the voltage holding electrode or the drain electrode of the field-effect transistor in the second pixel circuit is greater than an area of overlap between the electrode constituting the scanning signal line that passes through the corresponding intersection and the voltage holding electrode or the drain electrode of the field-effect transistor in the first pixel circuit, and greater than an area of overlap between the electrode constituting the scanning signal line that passes through the corresponding intersection and the voltage holding electrode or the drain electrode of the field-effect transistor in the third pixel circuit.

A fourteenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

A ratio L/W between a channel length L and a channel width W in the field-effect transistor increases with an increasing electrical distance from a location where an electric potential to be supplied to the common electrode line is applied to the common electrode line.

A fifteenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

The pixel circuits include a first, a second and a third pixel circuits, the first pixel circuit is closer to an end of the common electrode line and farther from a center of the common electrode line than the second pixel circuit. The third pixel circuit is closer to another end of the common electrode line and farther from the center of the common electrode line than the second pixel circuit, and a ratio L/W between a channel length L and a channel width W in the field-effect transistor in the second pixel circuit is greater than a ratio L/W between the channel length L and the channel width W in the field-effect transistor in both of the first and the third pixel circuits.

A sixteenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

One of the electrostatic capacities which are formed between the drain electrode of the field-effect transistor or the voltage holding electrode and other electrodes other than an electrostatic capacity Cgd between the gate electrode and the drain electrode of the field-effect transistor decreases with an increasing electrical distance from a location where an electric potential to be supplied to the common electrode line is applied to the common electrode line.

A seventeenth aspect of the present invention provides an active matrix substrate which includes:

data signal lines each for one of data signals;

scanning signal lines crossing with the data signal lines;

a matrix of pixel circuits each corresponding to one of intersections made by the data signal lines and the scanning signal lines; and a common electrode line disposed to form a predetermined electric capacity in each pixel circuit.

Each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing the predetermined electrostatic capacity between itself and the common electrode line.

The pixel circuits include a first, a second and a third pixel circuits, the first pixel circuit is closer to an end of the common electrode line and farther from a center of the common electrode line than the second pixel circuit. The third pixel circuit is closer to another end of the common electrode line and farther from the center of the common electrode line than the second pixel circuit, and one of the electrostatic capacities which are formed between the drain electrode of the field-effect transistor or the voltage holding electrode and other electrodes in the second circuit other than an electrostatic capacity Cgd between the gate electrode and the drain electrode of the field-effect transistor in the second circuit is smaller than one of the electrostatic capacities which are formed between the drain electrode of the field-effect transistor or the voltage holding electrode and other electrodes in the first circuit other than the electrostatic capacity Cgd between the gate electrode and the drain electrode of the field-effect transistor in the first circuit, and smaller than one of electrostatic capacities which are formed between the drain electrode of the field-effect transistor or the voltage holding electrode and other electrodes in the third circuit other than the electrostatic capacity Cgd between the gate electrode and the drain electrode of the field-effect transistor in the third circuit.

An eighteenth aspect of the present invention provides a drive circuit for the active matrix substrate according to the first through fifteenth aspect of the present invention. The drive circuit includes:

a scanning signal line drive circuit for selectively driving the scanning signal line by applying predetermined scanning signals respectively to the scanning signal lines.

The scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

A nineteenth aspect of the present invention provides the drive circuit according to the eighteenth aspect of the present invention. The scanning signal line drive circuit controls the speed of electric potential change of the scanning signals to be outputted from the scanning signal line drive circuit, based on a signal propagation delay characteristic of the scanning signal lines, so that the speed of electric potential change will be substantially equal regardless of the location on the scanning signal lines.

A twentieth aspect of the present invention provides a display device which includes the active matrix substrate according to one of the first through fifteenth aspects of the present invention, and a drive circuit for driving the active matrix substrate.

A twenty-first aspect of the present invention provides a display device according to the twentieth aspect of the present invention.

The drive circuit includes a scanning signal line drive circuit for selectively driving the scanning signal line by applying predetermined scanning signals respectively to the scanning signal lines.

The scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

A twenty-second aspect of the present invention provides a display device according to the twenty-first aspect of the present invention.

The scanning signal line drive circuit controls a speed of electric potential change of the scanning signals to be outputted from the scanning signal line drive circuit based on a signal propagation delay characteristic of the scanning signal line so that the speed of electric potential change will be substantially equal regardless of the location on the scanning signal lines.

Advantages of the Invention

According to the first aspect of the present invention, each pixel circuit is formed so that a value given by the equation $(Vgpp \cdot Cgd + \Delta Qd)/Cpix$ will be substantially equal among the pixel circuits in the active matrix substrate toward the goal of eliminating electric potential variations among the voltage holding electrodes, i.e. level shift differences among pixel potentials, caused by difference in the amount of charge which moves through the TFT to the voltage holding electrode (representing the pixel electrode in the crystal display device) due to difference in delay in various signal lines in each pixel circuit. This enables to substantially uniformalize the level shift $\Delta Vd$ in each pixel circuit.

According to the second aspect of the present invention, the charge amount $\Delta Qd$ is determined, taking into account a parasitic capacity between the scanning signal line and the common electrode line and/or a signal propagation delay characteristic of the common electrode line. Therefore, level shift non-uniformity of the pixel potential is eliminated or reduced sufficiently in an active matrix substrate which is formed with common electrode lines.

According to the third aspect of the present invention, the electrostatic capacity Cgd is formed so that a value given by the equation $(Vgpp \cdot Cgd + \Delta Qd)/Cpix$ will be substantially equal among the pixel circuits, whereby the same advantages as offered by the first aspect of the present invention can be enjoyed. According to the fourth aspect of the present invention, one of the electrostatic capacities which are formed between the drain electrode of the field-effect transistor or the voltage holding electrode and other electrodes other than the electrostatic capacity Cgd between the gate electrode and the drain electrode of the field-effect transistor is formed in each pixel circuit so that the value given by the equation $(Vgpp \cdot Cgd + \Delta Qd)/Cpix$ is substantially equal among the pixel circuits, whereby the same advantages as offered by the first aspect of the present invention can be enjoyed. According to the fifth aspect of the present invention, the field-effect transistor in each pixel circuit has a channel length and a channel width so selected that the value given by the equation $(Vgpp \cdot Cgd + \Delta Qd)/Cpix$ is substantially equal among the pixel circuits, whereby the same advantages as offered by the first aspect of the present invention can be enjoyed.

In both of the sixth and the seventh aspects of the present invention, each pixel circuit is formed so that the electrostatic capacity Cgd increases whereas a rate of the increase decreases with an increasing electrical distance from an inputting end of the scanning signal line (where the scanning signal is applied). This reduces nonuniformity of the level shift in the pixel potential caused by difference in the amount of charge which moves to the voltage holding electrode due to the signal propagation delay characteristic of the scanning signal lines, and uniformalizes the level shift distribution.

According to the eighth aspect of the present invention, each pixel circuit is formed so that a ratio L/W between a channel length L and a channel width W in the field-effect transistor increases whereas a rate of the increase decreases with an increasing electrical distance from an inputting end of the scanning signal line. This reduces nonuniformity of the level shift in the pixel potential caused by difference in the amount of charge which moves to the voltage holding electrode due to the signal propagation delay characteristic of the scanning signal lines, and uniformalizes the level shift distribution.

According to the ninth aspect of the present invention, each pixel circuit is formed so that at least one of the electrostatic capacities which are formed between the drain electrode of the field-effect transistor or the voltage holding electrode and other electrodes other than the electrostatic capacity Cgd between the gate electrode and the drain electrode of the field-effect transistor decreases while a rate of the decrease of said at least one electrostatic capacity decreases with an increasing electrical distance from a location of signal application to the scanning signal line. This reduces nonuniformity of the level shift in the pixel potential caused by difference in the amount of charge which moves to the voltage holding electrode due to the signal propagation delay characteristic of the scanning signal lines, and uniformalizes the level shift distribution.

In both of the tenth and the twelfth aspects of the present invention, each pixel circuit is formed so that the electrostatic capacity Cgd increases with an increasing electrical distance from an inputting end of the common electrode line (where a common electrode potential is applied). This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

Both the eleventh and the thirteenth aspects of the present invention cover a case in which an active matrix substrate is formed with common electrode lines and a common electrode potential (common electrode signal) is applied from both ends of each common electrode line. With the above, each pixel circuit is formed so that the electrostatic capacity Cgd increases with an increasing electrical distance from inputting ends of the common electrode line (where a common electrode potential is applied). This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

According to the fourteenth aspect of the present invention, each pixel circuit is formed so that a ratio L/W between a channel length L and a channel width W in the field-effect transistor increases with an increasing electrical distance from an inputting end of the common electrode line. This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

The fifteenth aspect of the present invention covers a case in which an active matrix substrate is formed with common electrode lines and a common electrode potential (common electrode signal) is applied from both ends of each common electrode line. With the above, each pixel circuit is formed so that a ratio L/W between a channel length L and a channel width W in the field-effect transistor increases with an increasing electrical distance from inputting ends of each common electrode line. This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

According to the sixteenth aspect of the present invention, one of the electrostatic capacities which are formed between the drain electrode of the field-effect transistor or the voltage holding electrode and other electrodes other than an electrostatic capacity Cgd between the gate electrode and the drain electrode of the field-effect transistor decreases with an increasing electrical distance from an inputting end of the common electrode line. This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

The seventeenth aspect of the present invention covers a case in which an active matrix substrate is formed with common electrode lines and a common electrode potential (common electrode signal) is applied from both ends of each common electrode line. With the above, one of the electrostatic capacities which are formed between the drain electrode of the field-effect transistor or the voltage holding electrode and other electrodes other than an electrostatic capacity Cgd between the gate electrode and the drain electrode of the field-effect transistor decreases with an increasing electrical distance from inputting ends of the common electrode line (where common electrode potential is applied). This reduces nonuniformity of the level shift in the pixel potential caused by difference in the amount of charge which moves to the voltage holding electrode due to parasitic capacities between the scanning signal line and the common electrode line as well as the signal propagation delay characteristic in the common electrode lines, and therefore uniformalizes the level shift distribution.

According to the eighteenth or the nineteenth aspect of the present invention, level shift non-uniformity of the pixel potential is reduced as in the first through the seventeenth aspects of the present invention. In addition, by controlling a speed of potential change in a transition from a scanning signal ON voltage to an OFF voltage outputted from the scanning signal line drive circuit, it becomes possible to substantially uniformalize the speed of potential change in each location on the scanning signal line. This eliminates or reduces nonuniformity of the level shift in the pixel potential caused by the signal propagation delay characteristic in the scanning signal lines.

According to the twentieth aspect of the present invention, level shift non-uniformity of the pixel potential is reduced as in the first through the seventeenth aspects of the present invention, enabling to provide high-quality images with reduced flickers, etc.

According to the twenty-first or the twenty-second aspect of the present invention, level shift non-uniformity of the pixel potential is reduced as in the eighteenth or the nineteenth aspects of the present invention, enabling to provide high-quality images with reduced flickers etc.

BRIEF DESCRIPTION OF THE DRAWINGS

FIG. 7-(B) shows a distribution of capacities between the scanning signal line and the pixel electrode according to the first embodiment. FIG. 7-(C) shows a distribution of pixel potentials after application of the configuration according to the first embodiment.

FIG. 13-(B) shows a distribution of capacities between the scanning signal line and the pixel electrode according to the second embodiment. FIG. 13-(C) shows a distribution of pixel potentials after application of the configuration according to the second embodiment.

FIG. 17-(B) shows a distribution of capacities between the scanning signal line and the pixel electrode according to the third embodiment. FIG. 17-(C) shows a distribution of pixel potentials after application of the configuration according to the third embodiment.

LEGEND

100 TFT substrate (active matrix substrate)
101 Opposed substrate
102 Thin-film transistor (TFT)
103 Pixel electrode (voltage holding electrode)
200 Data signal line drive circuit
300 Scanning signal line drive circuit
CS Common electrode line drive circuit
Ec Opposed electrode
P(i, j) Pixel circuit (i=1 to N, j=1 to M)
CS(j) Common electrode line (j=1 to M)
G(j) Scanning signal line (j=1 to M)
S(i) Data signal line (i=1 to N)
VD1 Input terminal
VD2 Input terminal
3a Shift register section
3b Selector switch (switch section)
GCK Clock signal
GSP Data signal (start pulse signal)
SC Slew-rate control circuit (gradient control section)
Cgd Capacity between scanning signal line and pixel electrode
Ccs Capacity between common electrode and pixel electrode (supplemental capacity)
Clc Capacity between opposed electrode and pixel electrode (liquid-crystal capacity)
Cpix Pixel capacity (voltage holding capacity)
Id(i, j) Waveform of current passing through TFT (i=1 to N, j=1 to M)
Vcs Common electrode potential
Vcs(i, j) Waveform of common electrode potential (i=1 to N, j=1 to M)
Vcom Opposed-electrode potential
Vd (i, j) Pixel potential (potential of the pixel electrode) (i=1 to N, j=1 to M)
Vdp Pixel potential (when positive voltage is applied)
Vdn Pixel potential (when negative voltage is applied)
Vg(j) Scanning signal (j=1 to M)
Vg(i, j) Voltage waveform of the scanning signal (i=1 to N, j=1 to M)
Vgl Gate-off voltage
Vgh Gate-on voltage
Vth TFT threshold voltage
Vs(i) Data signal (i=1 to N)
Vsp Data signal voltage (when positive voltage is applied)
Vsn Data signal voltage (when negative voltage is applied)
ΔVd(i, j) Pixel potential level shift (i=1 to N, j=1 to M)
ΔVdp(i, j) Pixel potential level shift (when positive voltage is applied) (i=1 to N, j=1 to M)
ΔVdn (i, j) Pixel potential level shift (when negative voltage is applied) (i=1 to N, j=1 to M)
ΔQd (i, j) Charge amount transferred from start to end of scanning signal trailing end 0=1 to N, j=1 to M)

BEST MODE FOR CARRYING OUT THE INVENTION

0. Basic Study

<0.1 Pixel Circuit and Signal Propagation Path>

Figure 9:
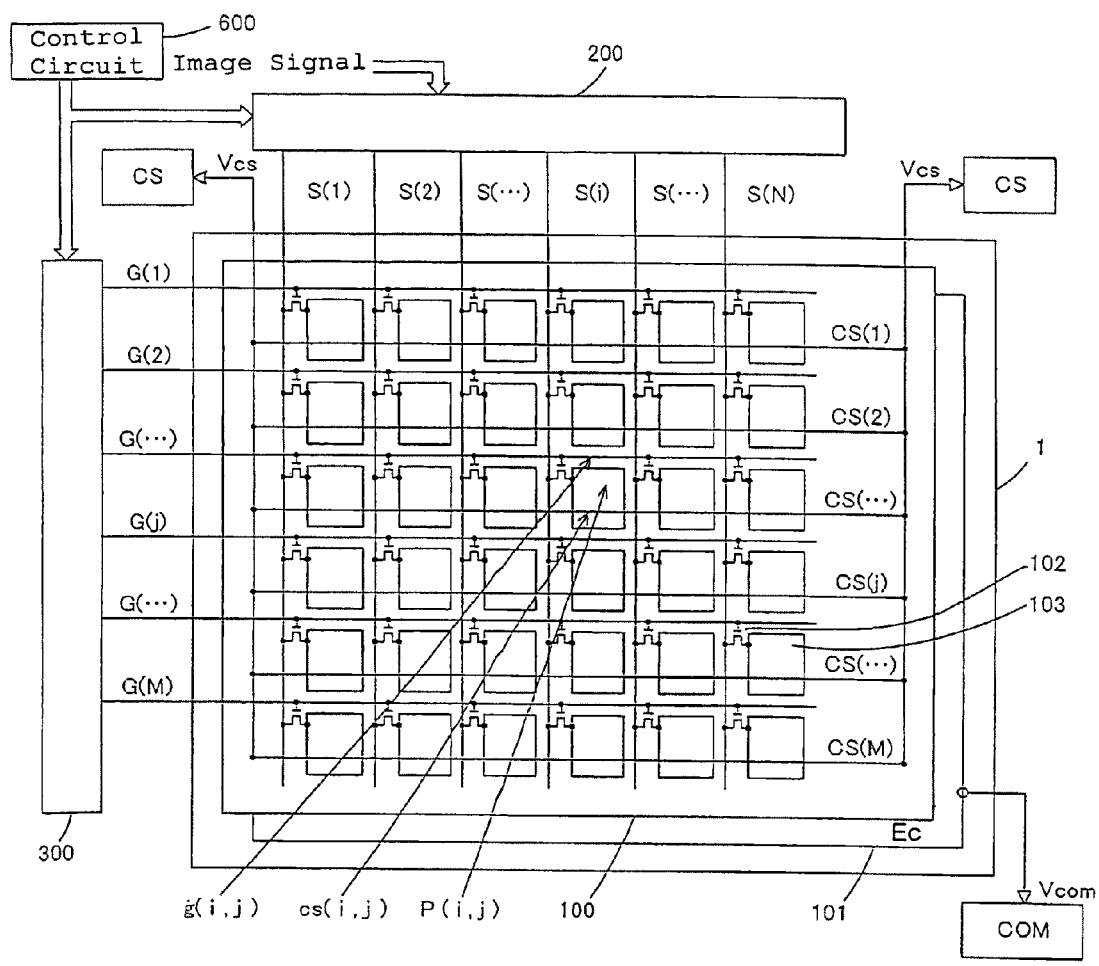
FIG. 9 is a block diagram showing an overall configuration of a liquid crystal display device which uses a TFT substrate as an active matrix substrate according to a second and a third embodiments of the present invention.

Before describing the embodiments of the present invention, description will cover a basic study conducted by the inventor of the present invention in order to accomplish the objects of the present invention. The basic study takes a case of a TFT substrate 100 which is an active matrix substrate configured as shown in FIG. 9. The TFT substrate 100 includes a transparent insulating substrate such as glass, on which a plurality (M) of scanning signal lines G(1) through G(M) and a plurality (N) of data signal lines S(1) through S(N) are formed to cross with each other. Further, correspondingly to each of the intersections, a pixel circuit P(i, j) (i=1 to N, j=1 to M) is formed in a matrix pattern as a plurality (M×N) of pixel formation regions. Also, a plurality of common electrode lines CS(1) through CS(M) are formed, each in parallel to a corresponding one of the scanning signal lines G(1) through G(M).

Figure 10:
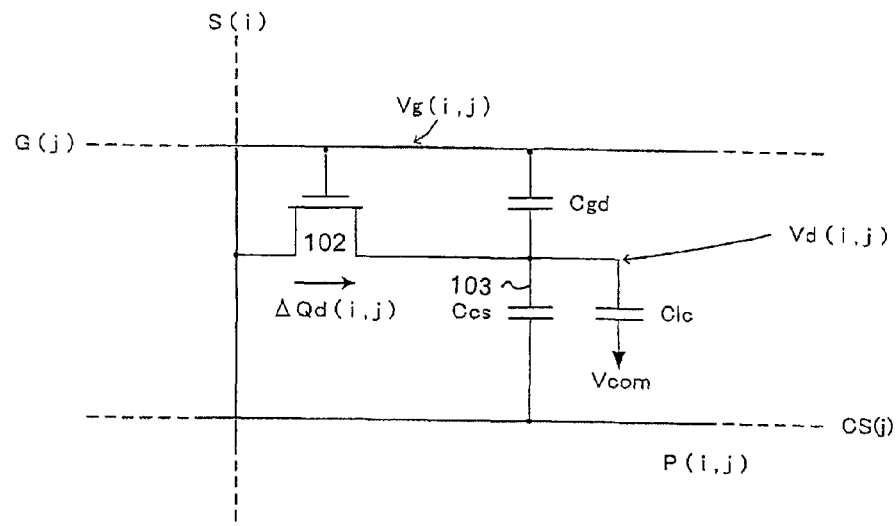
FIG. 10 is a circuit diagram showing a configuration of a pixel circuit in the TFT substrate as an active matrix substrate according to the second and the third embodiments.

As shown in FIG. 10, each pixel circuit P(i, j) includes: a TFT 102, i.e. a field-effect transistor serving as a switching element, which has its source electrode connected with the data signal line S(i) that passes the corresponding intersection, and its gate electrode connected with the scanning signal line G(j) that passes the corresponding intersection; and a pixel electrode 103 connected with the drain electrode of the TFT 102. The pixel electrode 103 and the opposed electrode Ec, which is formed on the entire surface of the opposed substrate, form a liquid-crystal capacity Clc. The pixel electrode 103 and common electrode line CS(j) form a common-electrode capacity Ccs, and the pixel electrode 103 and the scanning signal line G(j) form a parasitic capacity Cgd.

Figure 11:
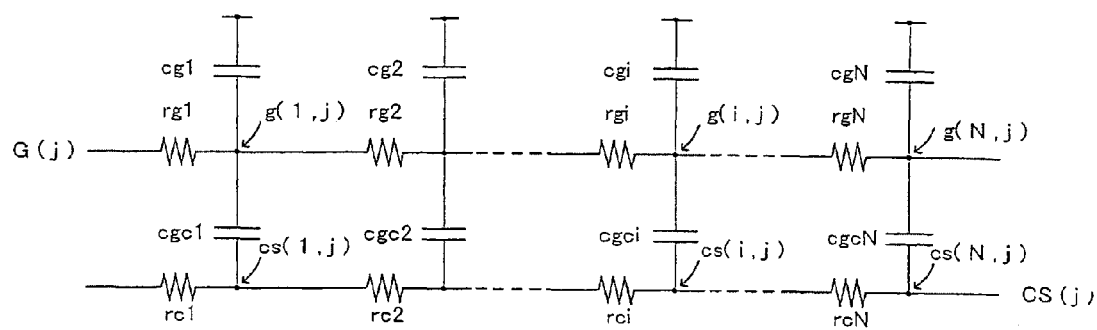
FIG. 11 is an equivalent circuit diagram showing propagation paths of scanning signals and a common electrode signal in the active matrix substrate according to the second and the third embodiments, with attention focused on signal propagation delay in one scanning signal line and one common electrode line.

In general, signal lines formed on a transparent insulating substrate such as glass, e.g. the scanning signal lines G(1) through G(M) and the common electrode line CS(1) through CS(M) formed on the TFT substrate 100, are difficult to form as idealized signal lines which are free from signal propagation delay. So, the lines have a certain degree of signal propagation delay characteristic. FIG. 11 is an equivalent circuit diagram showing propagation paths of a scanning signal and a common electrode signal, with attention focused on signal propagation delay in one scanning signal line G(j) and one common electrode line CS(j). In FIG. 11, resistors rg1, rg2, ..., rgi, ..., rgN each represent a resistance component of the scanning signal line G(j) for a pixel circuit, and its resistance value is determined primarily by the material of the wiring, the width of the wiring and the length of the wiring in the scanning signal line G(j). Resistors rc1, rc2, ..., rci, ..., rcN each represent a resistance component of the common electrode line CS(j) for a pixel circuit, and its resistance value is determined primarily by the material of the wiring, the width of the wiring and the length of the wiring in the common electrode line CS(j).

The inventor of the present invention discovered, through simulations, etc., that in the study of the above-described signal propagation, care must also be paid to influences from the parasitic capacity which is present between the scanning signal line and the common electrode line as shown in FIG. 11. In FIG. 11, capacities cgc1, cgc2, ..., cgci, ..., cgcN each represent a parasitic capacity per a pixel circuit resulting from a single-tier or multi-tier capacity-coupling relationship between the scanning signal line(s) and the common electrode line. For example, such a capacity results from a series capacity coupling of a capacity Cgd which is a capacity between the scanning signal line and the pixel electrode with a capacity Ccs which is a capacity between the pixel electrode and the common electrode line. Likewise, capacities cg1, cg2, ..., cgi, ..., cgN represent capacities obtained by subtracting the parasitic capacities cgc1 through cgcN, from various parasitic capacities formed by the scanning signal line and other electrodes/signal-lines which are in the capacity-coupling relationship with the scanning signal lines, and is constituted by e.g. a cross capacity resulting from crossing of a scanning signal line with a data signal line. Thus, the scanning signal lines and the common electrode lines are distributed-constant, delayed, signal-propagation paths.

<0.2 Voltage Waveform at Various Points>

As shown in FIG. 9, a liquid crystal display device which uses the above-described active matrix substrate provided by the TFT substrate 100 includes: a data signal line drive circuit 200 which applies data signals Vs(1) through Vs(N) to the data signal lines S(1) through S(N) respectively; a scanning signal line drive circuit 300 which applies scanning signals Vg(1) through Vg(M) to the scanning signal lines G(1) through G(M) respectively; two common electrode line drive circuits CS which give a common electrode potential Vcs to the common electrode lines CS(1) through CS(M), respectively from one end and the other end of the lines; and an opposed electrode drive circuit COM which gives an opposed-electrode potential Vcom to the opposed electrodes Ec.

Figure 4:
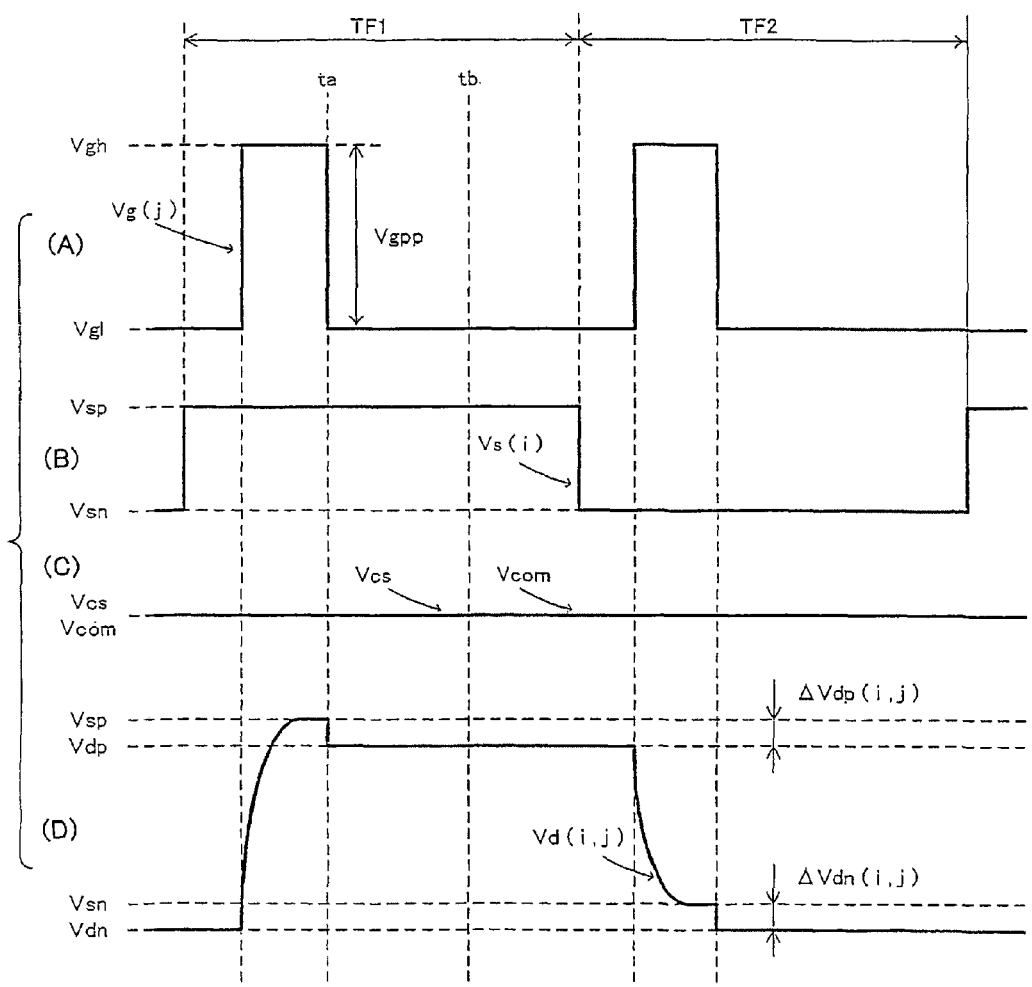
FIG. 4 is a schematically simplified voltage waveform chart of a signal and a pixel potential for driving a conventional TFT substrate as well as TFT substrates according to the first and the second embodiments.

FIG. 4-(A) shows a voltage waveform of a scanning signal Vg(j) applied from the scanning signal line drive circuit 300 to the scanning signal line G(j). FIG. 4-(B) shows a voltage waveform of a data signal Vs(i) applied from the data signal line drive circuit 200 to the data signal line S(i). FIG. 4-(C) shows a voltage waveform of a common electrode potential Vcs and an opposed-electrode potential Vcom given from the common electrode line drive circuit CS and the opposed electrode drive circuit COM to the common electrode line CS(j) and the opposed electrode Ec respectively. FIG. 4-(D) shows a voltage waveform of a pixel potential Vd (i, j) of the pixel circuit P(i, j) in the TFT substrate 100 shown in FIG. 9.

Figure 12:
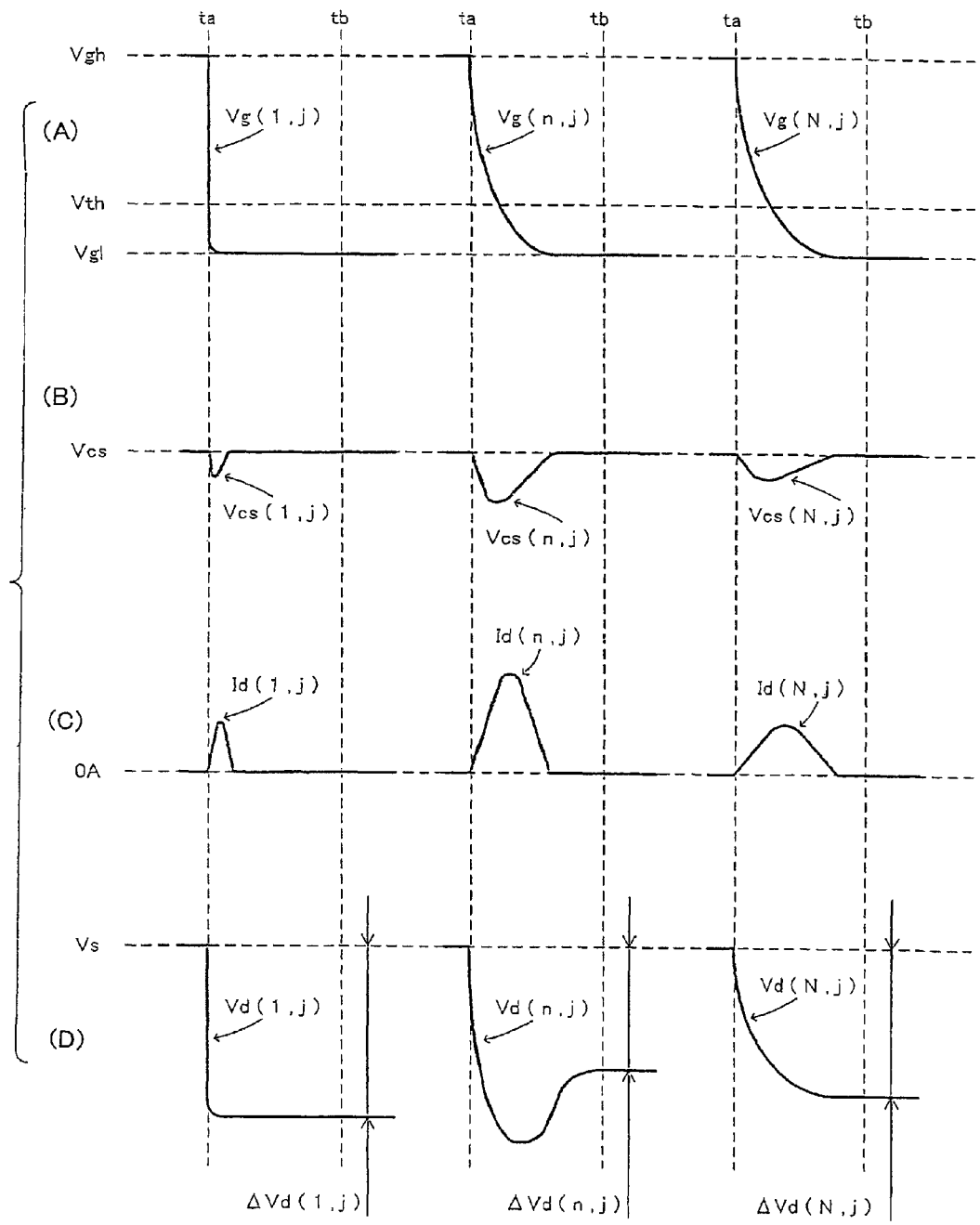
FIG. 12 is a waveform chart showing voltage waveforms and current waveforms in primary portions according to the second embodiment.

FIG. 12-(A) shows how the scanning signal Vg(j), which is applied from the scanning signal line drive circuit 300 to the scanning signal line G(j), is deformed in the panel (in the TFT substrate 100) due to the signal propagation delay characteristic (FIG. 11) of the scanning signal line G(j). FIG. 12-(B) shows how the potential Vcs(j) of the common electrode line CS(j) is deformed in the panel (in the TFT substrate 100) due to an influence from the parasitic capacity which is present between the scanning signal line G(j) and the common electrode line CS(j). It should be appreciated that, in the FIGS. 12-(A) and 12-(B), a symbol "Vg(i, j)" indicates a voltage waveform of the scanning signal Vg(j) in the pixel circuit P(i, j), whereas a symbol "Vcs(i, j)" indicates a voltage waveform of the common electrode potential Vcs in the pixel circuit P(i, j).

As shown in FIG. 12-(A), a voltage waveform Vg(1, j) of the scanning signal which is the voltage waveform of the potential at the gate electrode g(1, j) of the TFT in the pixel circuit P(1, j) (See FIG. 11) right after the output from the scanning signal line drive circuit 300 shows very little deformation. On the contrary, due to the above-described signal propagation delay characteristic, a voltage waveform Vg(n, j) of the scanning signal in an intermediate portion of the scanning signal line G(j) (at a center region of the TFT substrate 100) shows a deformation to a certain extent, whereas a voltage waveform Vg(N, j) near the terminating end of the scanning signal line G(j) shows a deformation to a grater extend.

As shown in FIG. 12-(B), there is no major waveform change in voltage waveforms Vcs(1, j) and Vcs(N, j) of the common electrode potential Vcs right after the output from the two common electrode line drive circuits CS. On the contrary, there is a big change in a voltage waveform Vcs(n, j) of the common electrode potential Vcs in a center portion of the common electrode line CS(j) (at a center region of the TFT substrate 100), due to an influence from the parasitic capacity between the scanning signal line G(j) and the common electrode line CS(j) as well as an influence from the signal propagation delay characteristic. The inventor of the present invention discovered this from a study based on the equivalent circuit in FIG. 11, computer simulation and so on.

<0.3 Pixel Potential Level Shift>

Figure 18:
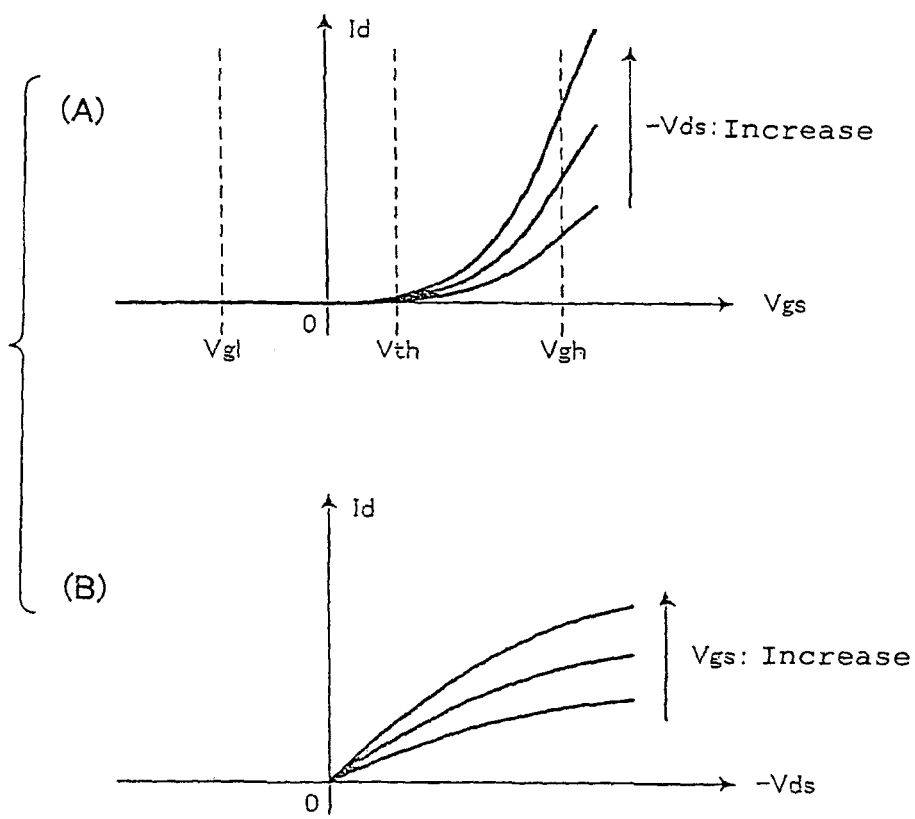
FIG. 18 is an explanatory diagram illustrating that a thin-film transistor has a Vgs-Vds-Id characteristic (gate-to-source voltage/drain-to-source voltage/drain current characteristic).
Figure 19:
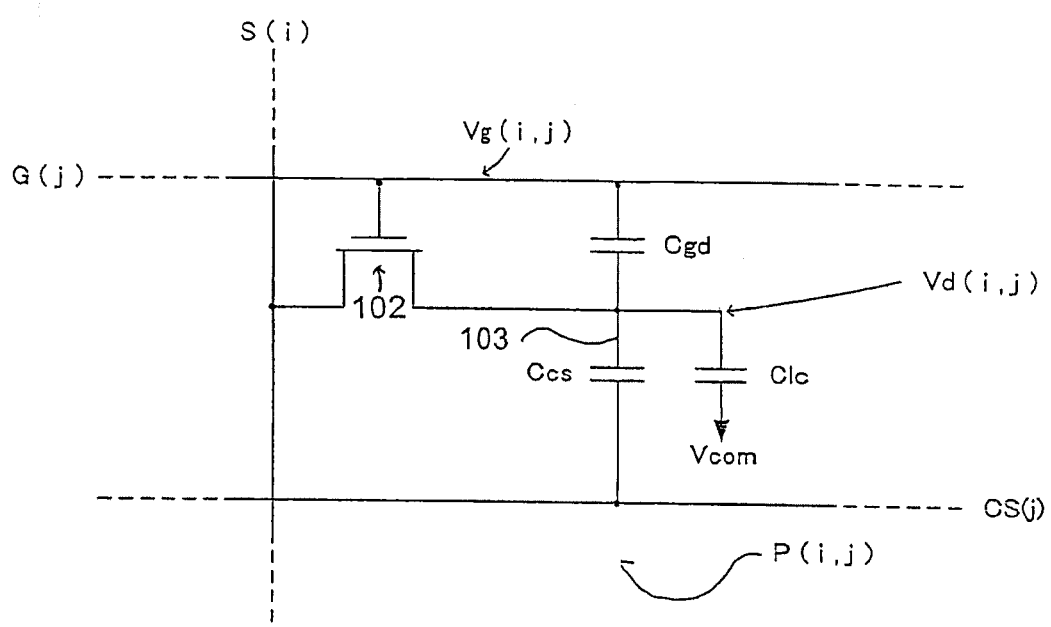
FIG. 19 is a circuit diagram showing a configuration of a pixel circuit in a TFT substrate as a conventional active matrix substrate.

The TFT 102 in each pixel circuit P(i, j) of the TFT substrate 100 as an active matrix substrate shown in Fit. 9 is not a perfect ON/OFF switch, but has a gate-to-source voltage/drain-to-source voltage/drain current characteristic (hereinafter called Vgs-Vds-Id characteristic) as shown in FIGS. 18-(A) and 18-(B). In FIG. 18-(A), the horizontal axis represents a voltage Vgs applied between the gate and the source of the TFT, whereas the vertical axis represents a drain current Id. In FIG. 18-(B), the horizontal axis represents a voltage Vds applied between the drain and the source of the TFT, whereas the vertical axis represents a drain current Id. The inventor of the present invention discovered that due to the Vgs-Vds-Id characteristic described above, variation are present in the level shift $\Delta Vd$ of the pixel potential Vd; specifically, that the level shift $\Delta Vd$ varies depending on the location of pixel circuit P(i, j) (hereinafter this will be referred to as "nonuniformity of the level shift $\Delta Vd$". Hereinafter, description will cover the nonuniformity of the level shift $\Delta Vd$.

Normally, a scanning pulse which serves as the scanning signal Vg(j) is a pulse whose potential changes between a voltage which is sufficient to turn ON the TFT (hereinafter called "gate-on voltage") Vgh and a voltage which is sufficient to turn OFF the TFT (hereinafter called "gate-off voltage") Vgl. As shown in FIG. 18-(A), from the time when the scanning signal given to the gate electrode of the TFT starts to fall from the gate-on voltage Vgh toward the gate-off voltage Vgl to the time when the signal comes completely down to the gate-off voltage level Vgl, there is a region from the gate-on voltage Vgh to near the TFT threshold voltage Vth which works as an intermediate ON region.

As shown in FIG. 12-(A), in the pixel circuit P(1, j) which is located right after the output point from the scanning signal line drive circuit 300, or more specifically, in the pixel circuit P(1, j) which is located near an inputting end of the scanning signal Vg(j) to the scanning signal line G(j) (Hereinafter, simply called "near an inputting end"), the scanning signal Vg(j) falls instantaneously from the gate-on voltage Vgh to the gate-off voltage level Vgl, so the characteristic of the intermediate ON region of the TFT has little effect. Generally, the amount of pixel potential change $\Delta Vd1$ due to capacity coupling can be expressed as follows, with the capacity between the scanning signal line G(j) and the pixel electrode represented by Cgd, and the pixel capacity represented by Cpix, and Vgpp=Vgl-Vgh:

$$\Delta Vd1 = Vgpp \cdot Cgd/Cpix \quad (1)$$

From the equation (1), the level shift $\Delta Vd(1, j)$ which occurs in the pixel potential Vd(1, j) near the inputting end can be approximated as:

$$\Delta Vd(1,j) = Vgpp \cdot Cgd/Cpix$$

Likewise, a level shift $\Delta Vd(n, j)$ occurs in the pixel potential Vd(n, j) of the pixel circuit P(n, j) which is located away from the scanning signal line drive circuit 300 and near the center of the scanning signal line G(j) (hereinafter, simply called "near the center"), and also, a level shift $\Delta Vd(N, j)$ occurs in the pixel potential Vd(N, j) of the pixel circuit P(N, j) which is located near the terminating end of the scanning signal line G(j) (hereinafter, simply called "near the terminating end"). However, the scanning signal voltage waveform Vg(n, j) near the center and the scanning signal voltage waveform Vg(N, j) near the terminating end are deformed in their falling edge, and therefore, affected by the above-described characteristic of the intermediate ON region of the TFT, resulting in reduced level shift in the pixel potential Vd (The absolute value becomes smaller). Therefore, the level shift $\Delta Vd(n, j)$ near the center and the level shift $\Delta Vd(N, j)$ near the terminating end are expressed as follows:

$$|\Delta Vd(n,j)| < |Vgpp \cdot Cgd/Cpix|,$$

$$|\Delta Vd(N,j)| < |Vgpp \cdot Cgd/Cpix|$$

This means that there are level shift differences between the region near the inputting end (right after the output from the scanning signal line drive circuit 300) and the other regions: namely, $$|\Delta Vd(n,j)| < |\Delta Vd(1,j)|,$$

$$|\Delta Vd(N,j)| < |\Delta Vd(1,j)|$$

In this way, there exists a nonuniformity of the level shift $\Delta Vd$, which will be detailed hereinafter using the equations and the drawings.

Attention will be focused to the scanning signal which is given to the gate electrode of each TFT (hereinafter called "gate signal"), and a time period between the time point to when the signal starts to fall and a later time point t: For the voltage of the gate signal (hereinafter called "gate voltage"), the amount of shift will be represented by $\Delta Vg(t)$. The amount of shift in the common electrode potential Vcs will be represented by $\Delta Vcs(t)$. The amount of shift in the opposed-electrode potential Vcom will be represented by $\Delta Vcom(t)$. The capacity between the gate and the drain will be represented by Cgd, the capacity between the pixel electrode and the common electrode line will be represented by Ccs, the capacity between the pixel electrode and the opposed electrode (liquid-crystal capacity) will be represented by Clc, the pixel capacity will be represented by Cpix(=Clc+Ccs+Cgd), the current which passes from the data signal line to the pixel electrode through the TFT will be represented by Id(t), and the amount of charge given by the current Id(t) to the pixel electrode will be represented by $\Delta Qd(t)$. With the above, the level shift $\Delta Vd(t)$ which occurs in the pixel potential Vd at the time point t can be expressed in the following equation (2):

$$\Delta Vd(t) = \Delta Vg(t) \cdot Cgd/Cpix + \Delta Vcs(t) \cdot Ccs/Cpix + \Delta Vcom(t) \cdot Clc/Cpix + \Delta Qd(t)/Cpix \quad (2)$$

Also, the current Id(t) which flows at the time point t in the above-described intermediate ON region is determined by the gate-source voltage Vgs(t) and the drain-source voltage Vds(t), and by the Vgs-Vds-Id characteristic shown in FIG. 18-(A) and FIG. 18-(B). The charge amount $\Delta Qd(t)$ which is given to the pixel electrode by the current flowing through the TFT from the time point ta when the gate signal starts to fall to the time point t is obtained as an integration value of the current Id(t) which flows through the TFT from the time ta to the time t.

In the above, the gate-source voltage Vgs(t) and the drain-source voltage Vds(t) of the TFT at the time point t satisfy the following relationship, where Vg(t) represents the gate voltage, and Vs(t) represents the source voltage (the voltage of the data signal) at the time point t:

$$Vgs(t)=Vg(t)-Vs \quad (3)$$

$$Vds(t)=\Delta Vd(t) \quad (4)$$

In this way, the charge amount $\Delta Qd(t)$ is determined uniquely by the Vgs-Vds-Id characteristic expressed in the equations (2) through (4) as well as FIG. 18-(A) and FIG. 18-(B). Specifically, the charge amount $\Delta Qd$ which is given to the pixel electrode by the current flowing through a TFT from the time when the gate voltage of the TFT starts to fall to the time when the voltage has fallen down completely is determined uniquely.

Now, assume that the gate voltage in each TFT has fallen down completely, and then sufficient time has elapsed to come to a time point tb. At this particular time point tb, $$\Delta Vg(t)=Vgpp=Vgl-Vgh,$$

$$\Delta Vcs(t)=0,$$

$$\Delta Vcom=0$$

Therefore, the level shift $\Delta Vd$ can be expressed as:

$$\Delta Vd=Vgpp \cdot Cgd/Cpix+\Delta Qd/Cpix \quad (5)$$

Due to the signal propagation delay characteristic of the scanning signal line G(j), the Vg(t) takes different values in different pixel circuit P(i, j): In a pixel circuit P(i, j) which is away from the scanning signal line drive circuit 300, the gate-source voltage Vgs(t) has a long period in which the voltage value is not smaller than the TFT threshold voltage Vth, and a large charge amount $\Delta Qd$ transfers to the pixel electrode via the TFT (Note: Vgpp<0, $\Delta Qd$>0 and $\Delta Vd$<0). For this reason, the level shift $\Delta Vd$ of the pixel potential Vd is reduced (the absolute value $|\Delta Vd|$ is decreased). Likewise, due to the signal propagation delay characteristic of the common electrode line CS(j), the amount of shift $\Delta Vcs(t)$ of the common electrode potential Vcs takes different values in different pixel circuit P(i, j): in a pixel circuit P(i, j) which is away from the common electrode line drive circuit CS, the $\Delta Vcs(t)$ is large and the transferred charge amount $\Delta Qd$ is large. This, too, reduces the level shift $\Delta Vd$ of the pixel potential Vd (the absolute value $|\Delta Vd|$ is decreased).

In this way, the level shift $\Delta Vd$ in the pixel potential Vd is not uniform within the TFT substrate 100, due to the signal propagation delay characteristics of the scanning signal line and the common electrode line and the TFT characteristic (FIG. 11, FIGS. 18-(A) and 18-(B)) in the TFT substrate 100 which serves as the active matrix substrate. Then, with increasing size of the screen and increasing level of fineness of the display device which uses this TFT substrate 100, the nonuniformity issue eventually comes to a point where it is no longer negligible.

The present invention was made on the basis of the above-described study and findings (discoveries) by the inventor of the present invention, with an object of eliminating or reducing the nonuniformity of the level shift $\Delta Vd$. Specifically, based on the equation (5), according to the present invention, formation of pixel circuits in the TFT substrate 100 is performed in such a way that each pixel circuit P(i, j) will have substantially equal (Vgpp·Cgd+$\Delta Qd$)/Cpix. In more specific words, as described in the following embodiments, etc., various electrostatic capacities (such as the capacity Cgd between the scanning signal line G(j) and the pixel electrode) and TFT characteristic in each pixel circuit P(i, j) of the TFT substrate 100 are varied in accordance with the location of the pixel circuit P(i, j), so that all the pixel circuits in the TFT substrate 100 will have substantially the same value for (Vgpp·Cgd+$\Delta Qd$)/Cpix. Hereinafter, embodiments of the present invention incorporating such an arrangement as the above will be described with reference to the attached drawings. It should be appreciated that the charge amount $\Delta Qd$ in the equation (5) is determined by the equations (2) through (4) and the Vgs-Vds-Id characteristic shown in FIGS. 18-(A) and 18-(B) as described earlier: Therefore, if the TFT substrate 100 is formed with common electrode lines, consideration must also be made, in addition to the parasitic capacity between the scanning signal line and the pixel electrode as well as the signal propagation delay characteristic of the scanning signal line, to the parasitic capacity between the scanning signal line and the common electrode line as well as the signal propagation delay characteristic of the common electrode line (See FIG. 11).

1. First Embodiment

Figure 1:
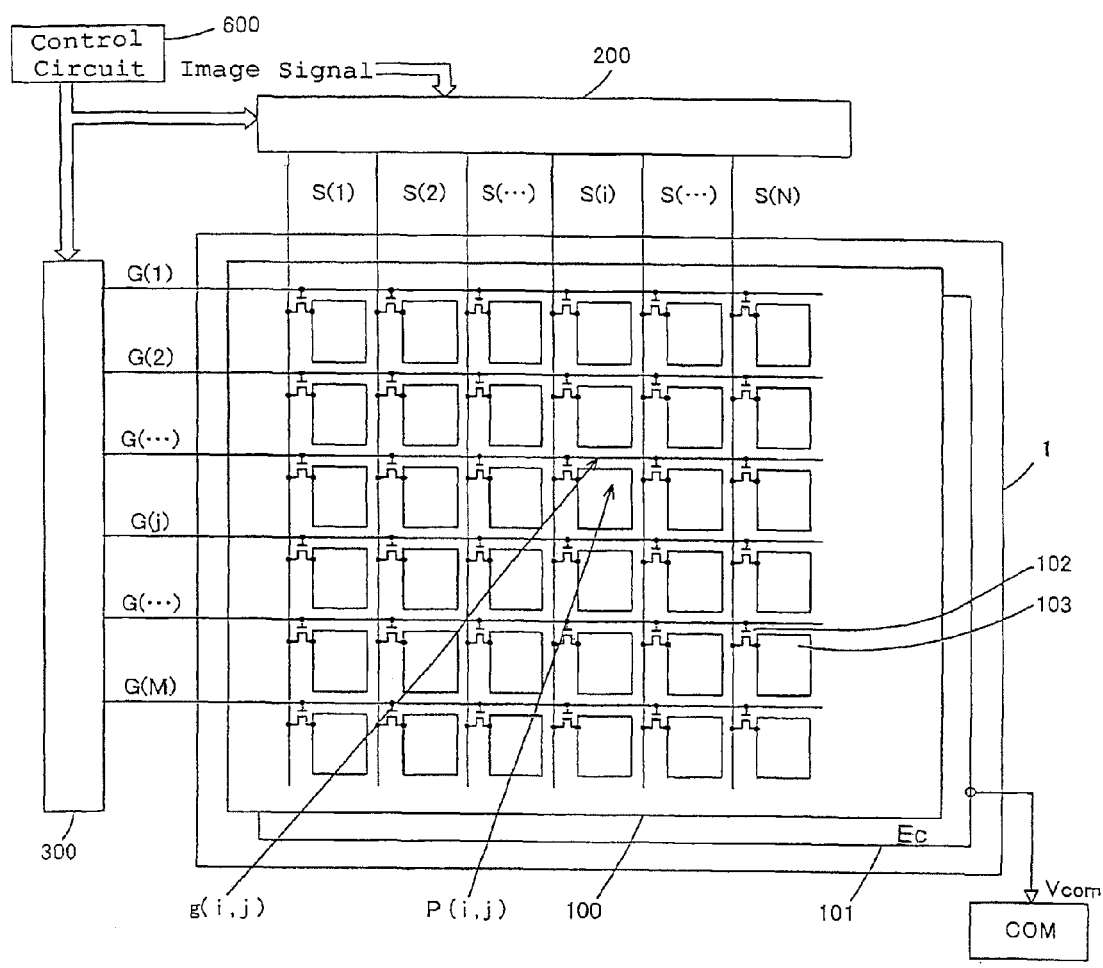
FIG. 1 is a block diagram showing an overall configuration of a liquid crystal display device which uses a TFT substrate as an active matrix substrate according to a first embodiment of the present invention.

FIG. 1 is a block diagram showing an overall configuration of a liquid crystal display device which uses a TFT substrate as an active matrix substrate according to a first embodiment of the present invention. The liquid crystal display device include: a liquid crystal display panel 1; a drive circuit including a data signal line drive circuit 200, a scanning signal line drive circuit 300 and an opposed electrode drive circuit COM; and a control circuit 600.

The liquid crystal display panel 1 is made of a pair of electrode substrate sandwiching a liquid crystal layer. Each electrode substrate has its outer surface covered by a polarizer. Of the pair of electrode substrates, one is an active matrix substrate called TFT substrate. The TFT substrate 100 includes an insulating substrate made of glass for example, formed with data signal lines S(1)-S(N) and scanning signal lines G(1)-G(M) crossing with each other in a grid pattern. Further, correspondingly to each of the intersections made by the data signal lines S(1)-S(N) and the scanning signal lines G(1)-G(M), a plurality (N×M) of pixel circuits P(i, j) are formed in a matrix pattern. Each of the pixel circuits P(i, j) corresponds to one of pixels which constitute images to be displayed. These signal lines S(1)-S(N), G(1)-G(M) and pixel circuits P(i, j) are covered virtually entirely by an alignment film. On the other hand, the other of the pair of electrode substrates is called opposed substrate, provided by a transparent insulating substrate such as glass, and has its entire surface laminated with an opposed electrode and then with an alignment film. Note that the present embodiment has a different configuration from the one in FIG. 9 which was described in the basic study, in that the TFT substrate 100 is not formed with common electrode lines.

Figure 2:
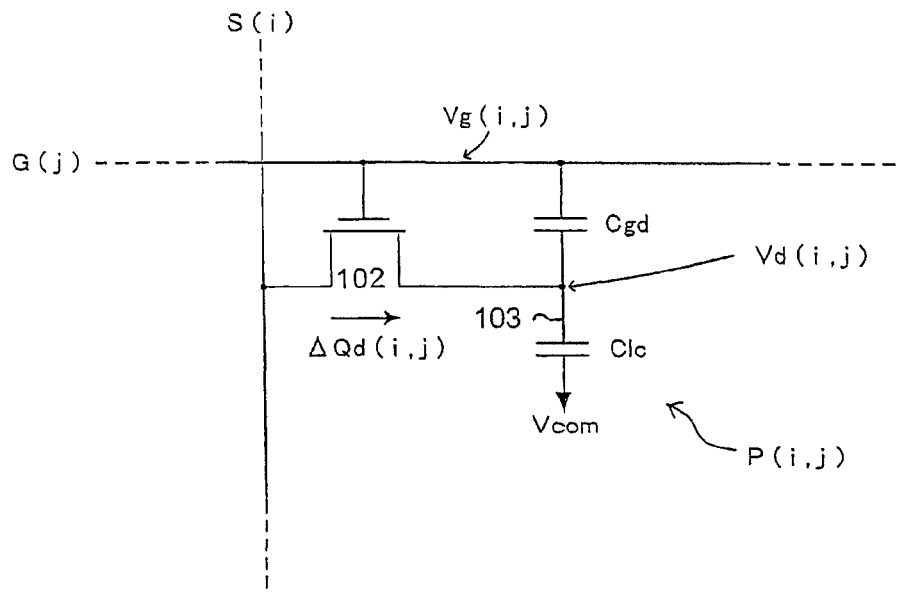
FIG. 2 is a circuit diagram showing a configuration of a pixel circuit according to the first embodiment.

Each pixel circuit P(i, j) includes a switching element provided by a field-effect transistor TFT 102, and a pixel electrode 103 connected with the data signal line S(i) via the TFT 102, having a circuit configuration as shown in FIG. 2. Specifically, each pixel circuit P(i, j) includes: a TFT 102 serving as a switching element, having its source electrode connected with the data signal line S(i) which passes the corresponding intersection, and its gate electrode connected with the scanning signal line G(j) which passes the corresponding intersection; and a pixel electrode 103 connected with the drain electrode of the TFT 102. The pixel electrodes 103 and the opposed electrode Ec which is formed on the entire surface of the opposed substrate 101 form a liquid-crystal capacity Clc. The pixel electrode 103 and the scanning signal line G(j) form a parasitic capacity Cgd. It should be appreciated that in the present embodiment, the pixel capacity Cpix, which is a capacity of capacitors formed by the pixel electrode 103 and other electrodes, and is a capacity for holding a voltage that represents the pixel value, includes the liquid-crystal capacity Clc and the parasitic capacity Cgd.

The control circuit 600 generates control signals for controlling the data signal line drive circuit 200, the scanning signal line drive circuit 300, etc. The data signal line drive circuit 200 receives control signals generated by the control circuit 600 and image signals from an outside source, and based on these, generates data signals Vs(1)-Vs(N) as analog voltages, and then applies these data signals Vs(1)-Vs(N) respectively to data signal lines S(1)-S(N) which are formed in the TFT substrate 100 of the liquid crystal display panel 1. The scanning signal line drive circuit 300 selects the scanning signal lines G(1)-G(M) in the liquid crystal display panel sequentially for each horizontal scanning period, and applies an active scanning signal (a voltage for turning ON the TFT in the pixel circuit) to the selected scanning signal line, in each frame period (each vertical scanning period) for displaying an image on the liquid crystal display panel. The opposed electrode drive circuit COM applies a signal which gives an electric potential that serves as a baseline for the voltage to be applied to the liquid crystal layer of the liquid crystal display panel 1 to the opposed electrode Ec which is formed on the entire surface of the opposed substrate 101.

Figure 3:
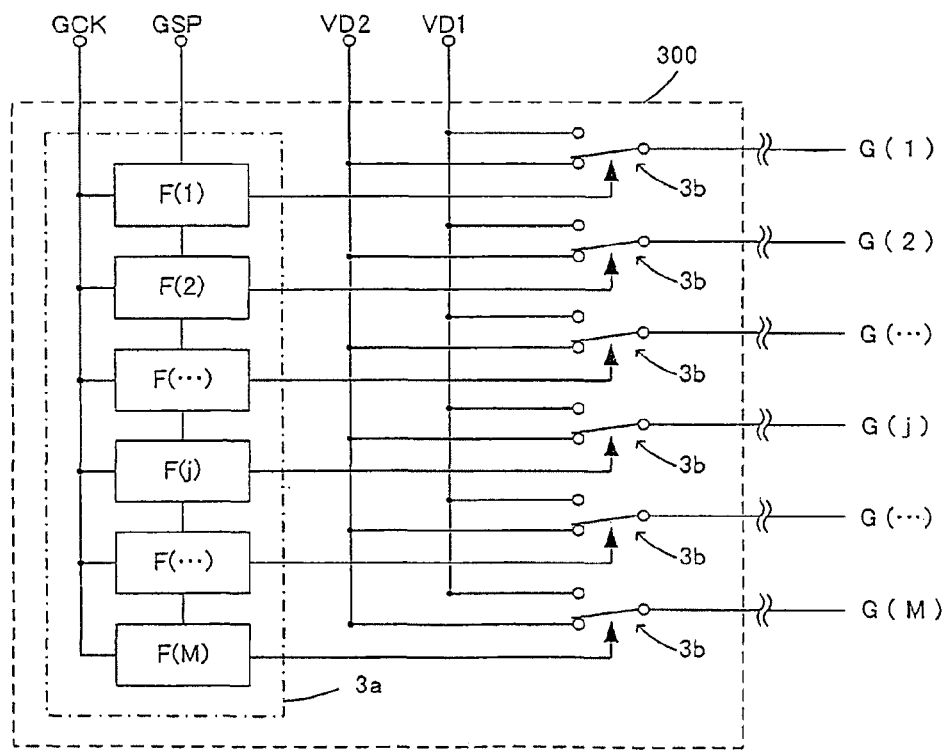
FIG. 3 is a block diagram showing an example of scanning signal line drive circuit according to the first embodiment.

FIG. 3 is a block diagram which shows a configuration example of the scanning signal line drive circuit 300. In this example, the scanning signal line drive circuit 300 includes: a shift register section 3*a* provided by a plurality (M) of cascade-connected flip-flops F(1), F(2) . . . F(j), . . . F(M); and selector switches 3*b* each changing states in accordance with an output from a corresponding flip-flop. Each selector switch 3*b* has an input terminal VD1 supplied with a gate-on voltage Vgh which is sufficient to turn ON the TFT 102 (See FIG. 1), and another input terminal VD2 supplied with a gate-off voltage Vgl which is sufficient to turn OFF the TFT 102. Therefore, in accordance with clock signals GCK supplied to each of the flip-flops F(1)-F(M), a data signal (start pulse signal) GSP inputted to the first flip-flop F(1) is transferred sequentially over each of the flip-flops F(1)-F(M), and outputted sequentially to each selector switch 3*b*. In response to this, each selector switch 3*b* outputs a gate-on voltage Vgh which turns ON the TFT 102, for a period of one selected scanning period (TH) to the scanning signal line G(j), and thereafter, outputs a gate-off voltage Vgl which turns OFF the TFT 102 to the scanning signal line G(j). Through this operation, the data signals Vs(1)-Vs(N) outputted from the data signal line drive circuit 200 to the corresponding data signal lines S(1)-S(N) (See FIG. 1) are respectively written to the corresponding pixel circuits P(i, j) (i.e. to the pixel capacity thereof).

When the TFT substrate 100 is driven as described above, schematically simplified voltage waveforms of the scanning signal Vg(j), the data signal Vs(i), the common electrode potential Vcs, the opposed-electrode potential Vcom, and the pixel potential (the potential of the pixel electrode) Vd (i, j) are as shown in FIGS. 4-(A) through 4-(D), i.e. generally the same as the waveforms in the convention described earlier, so no more description will be given here. However, these voltage waveforms are different in details from the convention, which will be described later.

Following the steps described above, a plurality of data signals Vs(1)-Vs(N) are applied to the data signal lines S(1)-S(N) respectively, and a plurality of scanning signals Vg(1)-Vg(M) are applied to the scanning signal lines G(1)-G(M) respectively, whereby the pixel electrode 103 in each pixel circuit P(i, j) of the liquid crystal display panel 1 is given, via the TFT 102, a voltage representing the value of the pixel for the image to be displayed, with a baseline provided by the potential Vcom of the opposed electrode Ec, and this voltage is held in the pixel capacity in each pixel circuit P(i, j). Thus, a voltage which is equal to the potential difference between each pixel electrode 103 and the opposed electrode Ec is applied to the liquid crystal layer. By controlling optical transmittance based on the applied voltage, the liquid crystal display panel 1 displays an image represented by the image signal received from e.g. an outside signal-source.

Figure 5:
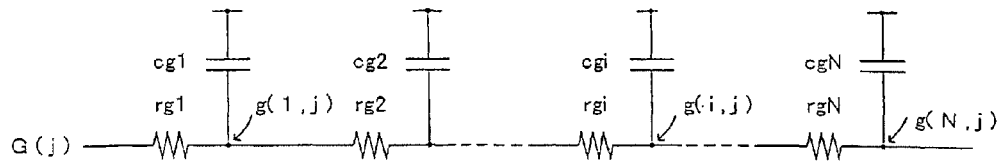
FIG. 5 is an equivalent circuit diagram showing a signal propagation path of the scanning signal in the active matrix substrate according to the first embodiment, with attention focused on signal propagation delay in one scanning signal line.

FIG. 5 is an equivalent circuit diagram showing a propagation path of a scanning signal, with attention focused on signal propagation delay in a scanning signal line G(j). The present embodiment (See FIG. 1) has a configuration which differs from the one shown in FIG. 9, i.e. there is no common electrode line. Therefore, the signal propagation delay characteristic in each scanning signal line G(j) can be evaluated on the basis of the equivalent circuit shown in FIG. 5, and the findings from the basic study are applicable to the present embodiment, except for the influence from the parasitic capacity and potential changes related to the common electrode lines. It should be appreciated that in FIG. 5, resistors rg1, rg2, . . . , rgi, . . . , rgN each represent a resistance component of the scanning signal line G(j) for a pixel circuit, and its resistance value is determined primarily by the material of the wiring, the width of the wiring and the length of the wiring in the scanning signal line G(j). Capacities cg1, cg2, . . . , cgi, . . . , cgc each represent various parasitic capacities for a pixel circuit, formed between the scanning signal line G(j) and other electrodes, signal lines, etc. which have a capacity coupling relationship with this scanning signal line. Hereinafter, description will cover details of the present embodiment which takes in account the signal propagation delay characteristic of the scanning signal line G(j) based on the equivalent circuit shown in FIG. 5.

Figure 6:
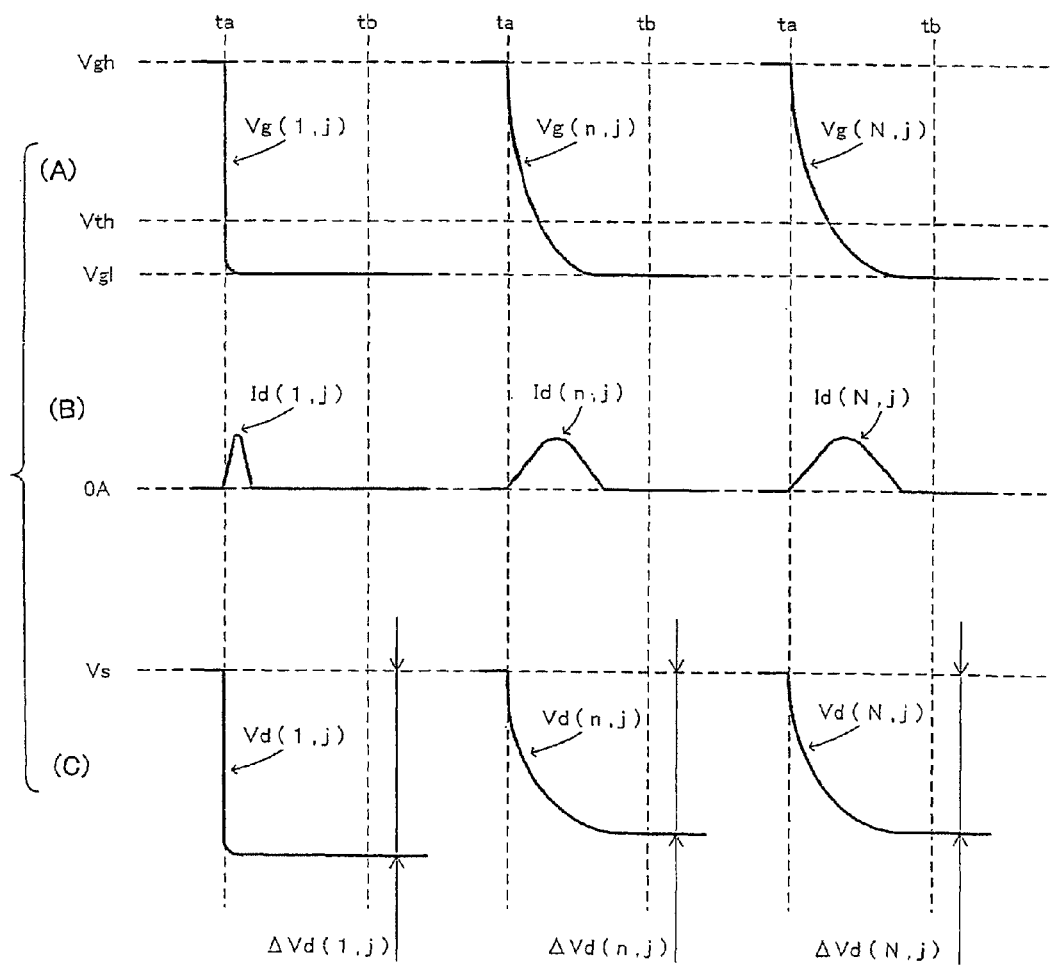
FIG. 6 is a waveform chart showing voltage waveforms and current waveforms in primary portions according to the first embodiment.

FIG. 6-(A) shows precise voltage waveforms (time course changes of a voltage) of a falling scanning signal at a gate electrode of the TFT 102 in the pixel circuit P(i, j) of the TFT substrate 100 according to the present embodiment which is configured as described above. Vg(1, j), Vg(n, j), and Vg(N, j) represent waveforms of the scanning signal Vg(j) near the inputting end (right after an output from the scanning signal line drive circuit 300), near the center and near the terminating end respectively, of the scanning signal line G(j). FIG. 6-(B) shows electric current waveforms (time course changes of the current) of the current which passes through the TFT 102 of the pixel circuit P(i, j) when the scanning signal Vg(j) falls from the gate-on voltage Vgh to the gate-off voltage Vgl. Id(1, j), Id(n, j) and Id(N, j) represent waveforms of the current which passes through the TFT 102 near the inputting end, near the center and near the terminating end respectively, of the scanning signal line G(j). FIG. 6-(C) represents waveforms of the potential of the pixel electrode 103 in the pixel circuit P(i, j) at the time when the scanning signal Vg(j) falls from the gate-on voltage Vgh to the gate-off voltage Vgl. Vd (1, j), Vd (n, j) and Vd (N, j) represent waveforms of the potential near the inputting end, near the center and near the terminating end respectively, of the scanning signal line G(j).

In the TFT substrate 100, the scanning signal Vg(j) is deformed in the TFT substrate 100 by the signal propagation delay characteristic of the scanning signal line G(j) in such a pattern as exemplified by the Vg(i, j) in FIG. 6-(A) (i=1, n, N).

Figure 7:
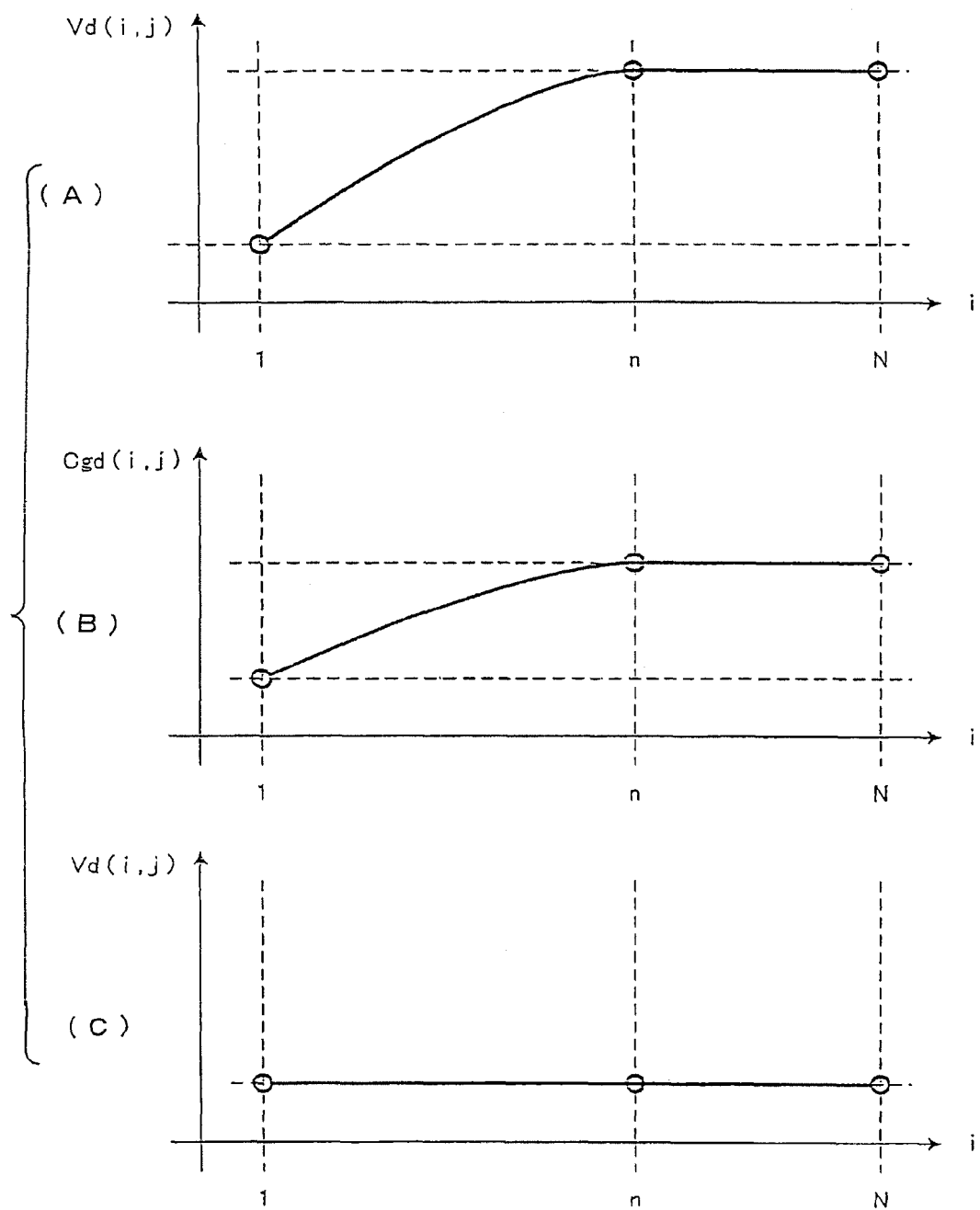
FIG. 7-(A) shows a distribution of pixel potentials before application of the configuration according to the first embodiment.
Figure 8:
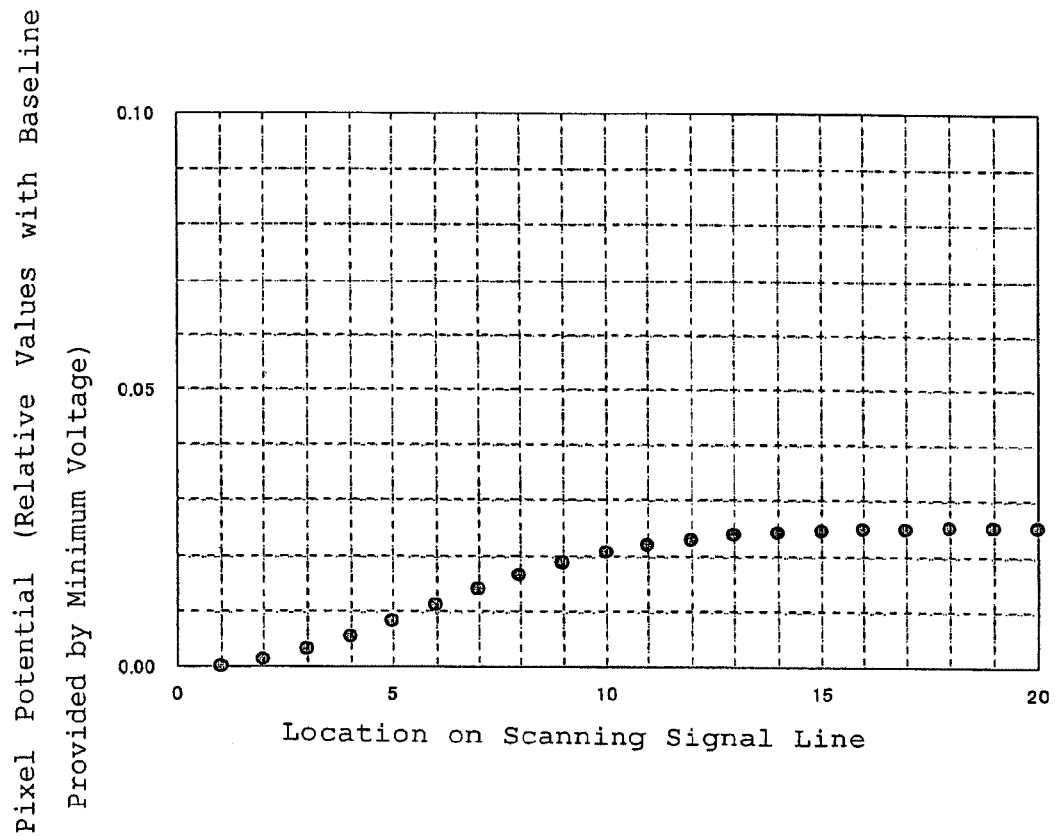
FIG. 8 shows a result of simulation on pixel potential distribution according to the first embodiment.

Because of these influences from the Vg(i, j) and various TFT characteristics (FIGS. 18-(A) and 18-(B)), the waveform Id(i, j) of the current which flows through the TFT 102 during the time when the gate electrode voltage (gate voltage) in each TFT 102 is falling from the gate-on voltage Vgh to the gate-off voltage Vgl takes different forms as shown in FIG. 6-(B), depending on the location on the scanning signal line G(j) (More generally, depending on the location on the TFT substrate 100). Thus, the charge amount ΔQd(i, j) which transfers to the pixel electrode 103 via the TFT 102 during the time when the gate voltage in each TFT 102 falls from the gate-on voltage Vgh to the gate-off voltage Vgl takes different values depending on the location on the scanning signal line G(j). Therefore, if all pixel circuits P(i, j) have the same parasitic capacity Cgd between the scanning signal line and the pixel electrode (between the gate electrode and the drain electrode of the TFT 102) as in the conventional TFT substrate 100, the potential waveform Vd (i, j) of the pixel electrode 103 changes as shown in FIG. 6-(C), depending on the location on the scanning signal line G(j), due to the differences in charge transfer to the pixel electrodes 103. As a result, even after a sufficient amount of time has passed since the scanning signal Vg(j) fell down to the gate-off voltage Vgl, the level shift ΔVd(i, j) in the potential Vd(i, j) of each pixel electrode takes different values depending on the location on the scanning signal line G(j), resulting in distribution nonuniformity of the level shift ΔVd, due to the differences of the charge amount ΔQd(i, j) based on the equation (5) discussed in the basic study. Specifically, the potential Vd(i, j) of the pixel electrode 103 changes as shown in FIG. 7-(A) depending on the location i on the scanning signal line G(j). In more specific words, the potential Vd(i, j) of the pixel electrode 103 increases as the distance from the inputting end (scanning signal line drive circuit 300) increases, with the rate of increase decreasing as the distance from the inputting end increases. In response to this, the absolute value |ΔVd| of the level shift in the pixel potential Vd decreases as the distance from the inputting end increases, but the rate of decrease decreases as the distance from the inputting end increases. This is attributable to the fact that the propagation path for the scanning signal Vg(j) is a CR-distributed constant wiring in which high-frequency components is lost increasingly as the distance from the scanning signal line drive circuit 300 increases. Computer simulations gave a similar result as shown in FIG. 8.

The present embodiment takes care of the above-described nonuniformity of the pixel potential Vd(i, j) or the level shift ΔVd (FIG. 7-(A)), by forming each pixel circuit P(i, j) so that the parasitic capacity Cgd between the scanning signal line and the pixel electrode (between the gate electrode and the drain electrode of the TFT 102) in each pixel circuit P(i, j) will be different in accordance with the location on the scanning signal line G(j) (more generally, the location in the TFT substrate 100) as shown in FIG. 7-(B). Specifically, each pixel circuit P(i, j) is formed in such a way that the parasitic capacity Cgd or the correction amount ΔCgd will be substantially equal to |ΔQd/Vgpp| (the correction amount ΔCgd refers to a capacity component of the parasitic capacity Cgd to be varied in accordance with the location). More accurately, values of the parasitic capacity Cgd are adjusted by means of simulations, for example, so that (Vgpp·Cgd+ΔQd)/Cpix will be constant. This means that each pixel circuit P(i, j) is formed in such a way that the parasitic capacity Cgd will increase as the distance from the inputting end of the scanning signal line G(j) increases, but the rate of the increase will become smaller as the distance from the inputting end increases. Thus, each pixel circuit P(i, j) is formed so that its parasitic capacity Cgd will be larger as the circuit becomes electrically farther away from the scanning signal line drive circuit 300. As a result, as shown in FIG. 7-(C), it becomes possible that in all pixel circuits P(i, j), the potential Vd (i, j) of the pixel electrode 103 and its level shift ΔVd have substantially the same values regardless of their location on the scanning signal line G(j) (the location in the TFT substrate 100), i.e. making possible to uniformalize the distribution of level shift ΔVd. It should be appreciated that the parasitic capacity Cgd can be changed in accordance with its location on the scanning signal line G(j) by changing the overlap area between the scanning signal line G(j) and the pixel electrode 103 and/or the overlap area between the scanning signal line G(j) and the drain electrode of the TFT 102. In more specific words, the method disclosed in Patent Document 4 (Japanese Patent Laid-Open Hei 11-84428 Gazette) can be utilized.

According to the present embodiment as described, non-uniformity of the level shift ΔVd is eliminated or reduced due to the arrangement that the pixel circuits P(i, j) are so formed that the parasitic capacity Cgd will be different in accordance with the location on the scanning signal line G(j) correspondingly to the distribution of pixel potential Vd or of the level shift ΔVd. Thus, it is possible to provide high-quality images with reduced flickers etc. in a liquid crystal display device which uses a TFT substrate according to the present embodiment.

It should be appreciated that Patent Document 4 (Japanese Patent Laid-Open Hei 11-84428 Gazette) discloses a technique which employs an arrangement that the capacity Cgd (Cgs) between the scanning signal line and the pixel electrode is made smaller on the input side of the scanning signal line (gate signal line), and greater on the terminating end side. This intends to uniformalize a level shift in the potential caused by capacity couplings due to nonuniform influences of the delay in scanning signal line to each pixel. However, no consideration is made as to the level shift variation in each pixel potential in each TFT caused by the change in charge amount which flows through the TFT from the time when the gate signal starts to fall to the time when the signal has completely fallen down. Therefore, level shift non-uniformity of the pixel potential cannot be eliminated or reduced sufficiently by utilizing the technique disclosed in the Gazette alone.

2. The Second Embodiment

FIG. 9 is a block diagram showing an overall configuration of a liquid crystal display device which uses a TFT substrate as an active matrix substrate according to a second embodiment of the present invention. This liquid crystal display device has the same configuration as the liquid crystal display device taken in the basic study which uses a TFT substrate as an active matrix substrate. Unlike the first embodiment, each of the scanning signal lines G(1)-G(M) formed on the TFT substrate 100 is accompanied by a corresponding one of the common electrode lines CS(1)-CS(M) which lies in parallel thereto. With this arrangement, the embodiment includes two common electrode line drive circuits CS which give a common electrode potential Vcs to each of the common electrode lines CS(1)-CS(M), respectively from one and the other ends of the lines. Otherwise, the present embodiment is the same as the liquid crystal display device (FIG. 1) which uses a TFT substrate 100 according to the first embodiment; therefore, identical elements will be indicated with the same reference symbols, and their details will not be repeated.

Each pixel circuit P(i, j) in the present embodiment includes a field-effect transistor, or a TFT 102 as a switching element, and a pixel electrode 103 connected with the data signal line S(i) via the TFT 102. The common electrode line CS(j) extends over the pixel electrode 103 via an insulating layer, as illustrated in a circuit configuration in FIG. 10. Specifically, each pixel circuit P(i, j) includes: a TFT 102 serving as a switching element, having its source electrode connected with the data signal line S(i) which passes the corresponding intersection, and its gate electrode connected with the scanning signal line G(j) which passes the corresponding intersection; and a pixel electrode 103 connected with the drain electrode of the TFT 102. The pixel electrodes 103 and the opposed electrode Ec formed on the entire surface of the opposed substrate 101 form a liquid-crystal capacity Clc. The pixel electrodes 103 and the common electrode lines CS(j) form a common electrode capacity Ccs. The pixel electrodes 103 and the scanning signal lines G(j) form a parasitic capacity Cgd. It should be appreciated that in the present embodiment, the pixel capacity Cpix, which is a capacity of capacitors formed by the pixel electrode 103 and other electrodes, and is a capacity for holding a voltage that represents the pixel value, includes the liquid-crystal capacity Clc, common-electrode capacity Ccs and the parasitic capacity Cgd.

An equivalent circuit of the signal propagation path of the scanning signal and the common electrode signal according to the present embodiment is as described in the basic study, i.e. a configuration shown in FIG. 11. FIG. 11 is an equivalent circuit diagram showing propagation paths of the scanning signal and the common electrode signal, with attention focused on signal propagation delay in one scanning signal line G(j) and one common electrode line CS(j). Hereinafter, description will cover details of the present embodiment which takes in account the signal propagation delay characteristic of the scanning signal G(j), with reference to the equivalent circuit shown in FIG. 11.

When the TFT substrate 100 having the configuration described above is driven, schematically simplified voltage waveforms of the scanning signal Vg(j), the data signal Vs(i), the common electrode potential Vcs, the opposed-electrode potential Vcom, and the pixel potential Vd (i, j) are as shown in FIGS. 4-(A) through 4-(D), i.e. generally the same as the waveforms in the first embodiment and the convention described earlier, so no more description will be given here. However, these voltage waveforms are different in details from the first embodiment, which will be described here below.

FIG. 12-(A) shows precise voltage waveforms of a falling scanning signal at a gate electrode of the TFT 102 in the pixel circuit P(i, j) of the TFT substrate 100 according to the present embodiment which is configured as described above. Vg(1, j), Vg(n, j), and Vg(N, j) represent voltage waveforms of the scanning signal Vg(j) near the inputting end, near the center and near the terminating end respectively of the scanning signal line G(j). FIG. 12-(B) shows potential waveforms Vcs (i, j) in a part of common electrode line CS(j) which overlaps the pixel electrode 103 of the pixel circuit P(i, j), (more specifically, potential waveforms when the scanning signal Vg(j) falls from the gate-on voltage Vgh to the gate-off voltage Vgl). Vcs(1, j), Vcs(n, j) and Vcs(N, j) represent potential waveforms in the common electrode line CS(j), near the inputting end, near the center and near the terminating end respectively of the scanning signal line G(j). FIG. 12-(C) represents waveforms of the current Id(i, j) which flows through the TFT 102 in the pixel circuit P(i, j) at the time when the scanning signal Vg(j) falls from the gate-on voltage Vgh to the gate-off voltage Vgl. Id(1, j), Id(n, j) and Id(N, j) represent waveforms of the current near the inputting end, near the center and near the terminating end respectively of the scanning signal line G(j). FIG. 12-(D) shows potential waveforms Vd(i, j) of the pixel electrode 103 in the pixel circuit P(i, j) when the scanning signal Vg(j) falls from the gate-on voltage Vgh to the gate-off voltage Vgl. Vd (1, j), Vd (n, j) and Vd (N, j) represent potential waveforms of the pixel electrode 103, near the inputting end, near the center and near the terminating end respectively of the scanning signal line G(j). It should be appreciated that in the following embodiments, voltage waveforms, potential waveforms and current waveforms on various locations on the scanning signal line G(j) will be indicated by using the same notation as has been used.

In the TFT substrate 100, the scanning signal Vg(j) is deformed in the TFT substrate 100 by the signal propagation delay characteristic of the scanning signal line G(j) in such a pattern as exemplified by Vg(i, j) in FIG. 12-(A) (i=1, n, N). As shown in FIG. 11, parasitic capacities are present between the common electrode line CS(j) and the scanning signal line G(j), due to the intervention by the capacity Cgd formed between the scanning signal line and the pixel electrode and the capacity Ccs formed between the pixel electrode and the common electrode line. For this reason, the potential in the common electrode line CS(j) is affected by the voltage waveform Vg(i, j) of the scanning signal in each pixel circuit P(i, j), and further, due to the signal propagation characteristic of the common electrode line CS(j), the potential waveform Vcs(i, j) in the common electrode line CS(j) changes as shown in FIG. 12-(B), depending on the location on the scanning signal line G(j) (According to the present embodiment, this also is the location on the common electrode line CS(j), and more generally is the location in the TFT substrate 100).

Figure 13:
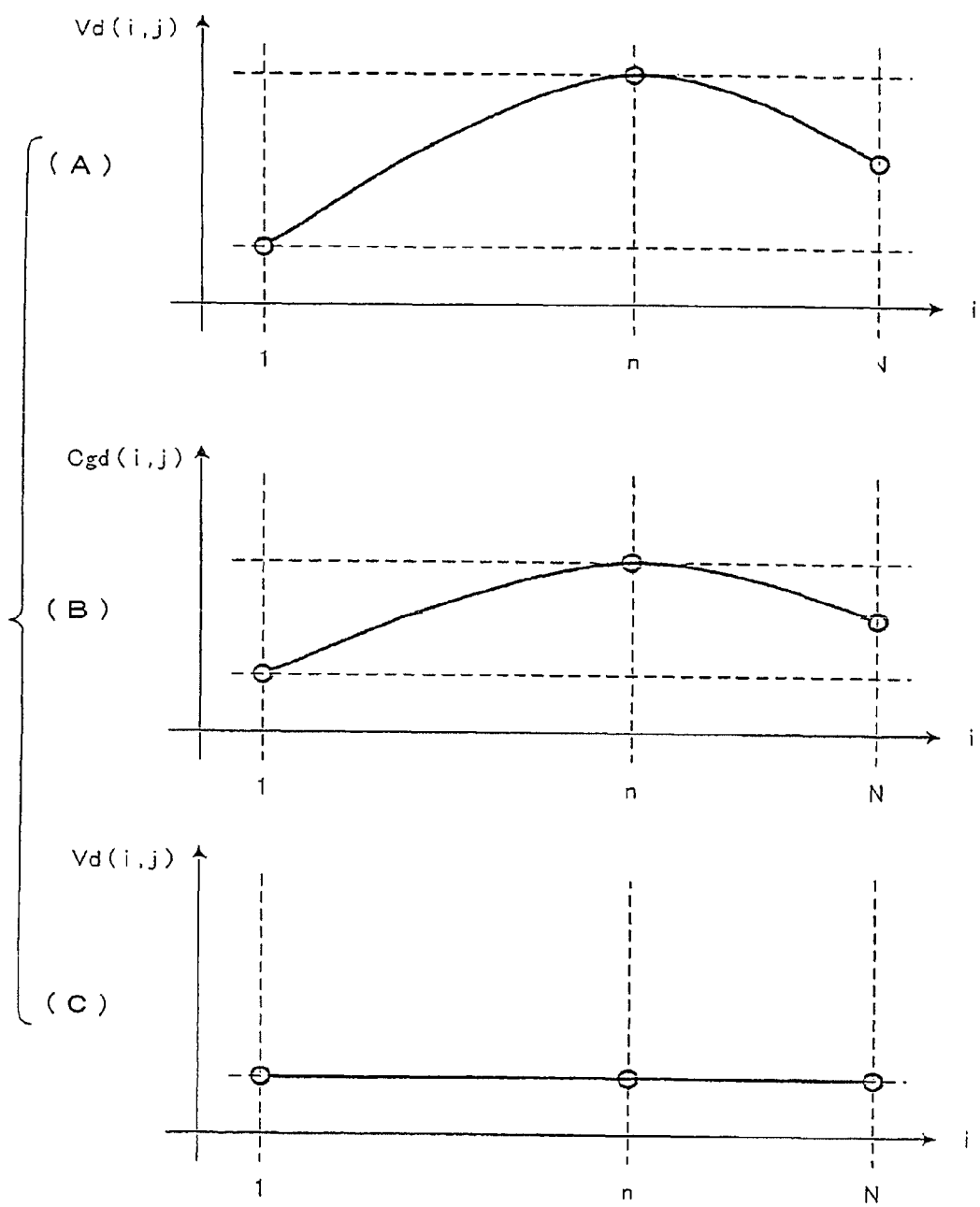
FIG. 13-(A) shows a distribution of pixel potentials before application of the configuration according to the second embodiment.

Because of influences from the voltage waveform Vg(i, j) and the potential waveform Vcs(i, j) as well as the TFT characteristic differences (FIGS. 18-(A) and 18-(B)), the waveform Id(i, j) of the current which flows through the TFT 102 during the time when the gate electrode voltage in each TFT 102 is falling from the gate-on voltage Vgh to the gate-off voltage Vgl takes different forms as shown in FIG. 12-(C), depending on its location on the scanning signal line G(j) or on the common electrode line CS(j). Thus, the charge amount ΔQd(i, j) which transfers to the pixel electrode 103 via the TFT 102 during the time when the gate voltage in each TFT 102 falls from the gate-on voltage Vgh to the gate-off voltage Vgl takes different values depending on the location on the scanning signal line G(j). Therefore, if all the pixel circuits P(i, j) have the same parasitic capacity Cgd between the scanning signal line and the pixel electrode (between the gate electrode and the drain electrode of the TFT 102) as in the conventional TFT substrate 100, the potential waveform Vd (i, j) of the pixel electrode 103 changes as shown in FIG. 12-(D), depending on the location on scanning signal line G(j), due to the differences in charge transfer amount to the pixel electrodes 103. As a result, even after a sufficient amount of time has passed since the scanning signal Vg(j) fell down to the gate-off voltage Vgl, the level shift ΔVd (i, j) of the potential Vd (i, j) in each pixel electrode is different depending on the locations on the scanning signal line G(j), resulting in nonuniformity in the distribution of the level shift tVd, due to the differences of the charge amount ΔQd(i, j) based on the equation (5) which was discussed in the basic study. Specifically, the potential Vd (i, j) of the pixel electrode 103 changes as shown in FIG. 13-(A) depending on the location on the scanning signal line G(j). In more specific words, the potential Vd (i, j) of the pixel electrode 103 increases as the distance from the inputting end (scanning signal line drive circuit 300) increases, attains a maximum value (peaks off) in a center portion, and then decreases as the distance from the center portion increases toward the terminating end; however, the pixel potential Vd (N, j) near the terminating end does not drop as low as the pixel potential (1, j) near the inputting end. In response to these, the absolute value |ΔVd| of the level shift in the pixel potential Vd decreases as the distance from the inputting end increases, attains a minimum value near the center, and then increases as the distance from the center portion increases toward the terminating end. However, the absolute value |ΔVd(N, j)| of the level shift near the terminating end does not increase as to the absolute value |ΔVd(1, j)| of the level shift near the inputting end.

A reason why the level shift absolute value |ΔVd| takes a minimum value (and the pixel potential Vd (i, j) takes a maximum value) in the center portion of the scanning signal line G(j) is that the common electrode line CS(j) is in parallel to the scanning signal line G(j), and the common electrode line CS(j) receives input from its two ends, i.e. the common electrode potential Vcs is applied by the common electrode line drive circuits CS. Specifically, the potential Vcs(i, j) of the common electrode line CS(j) is influenced by the pulse fall of the scanning signal Vg(j), and this influence becomes stronger as the electrical distance from the two common electrode line drive circuits CS increases. Since two common electrode line drive circuits CS are connected with the two ends of common electrode line CS(j) respectively according to the present embodiment (FIG. 9), the influence is greater at locations which are closer to the center of the scanning signal line G(j) (and the center also means the center in the common electrode line CS(j)). Therefore, the potential of the common electrode line CS(j) changes as shown in FIG. 12-(B) with the fall of the scanning signal Vg(j), making a big transitional change near the center of the scanning signal line G(j), and in response to this, drain-source voltage Vds of the TFTc 102 in the pixel circuit P(n, j) near the center makes a large transitional increase. Therefore, not only due to the Vgs-Id characteristic of the TFT but also due to the Vds-Id characteristic of the TFT (See FIGS. 18-(A) and 18-(B)), the drain current Id(n, j) of the TFT 102 in pixel circuits P(n, j) near the center of scanning signal line G(j) increases, and the charge amount ΔQd which moves to the pixel electrode 103 increases. As a result, the potential Vcs of the common electrode line CS(j) exerts an influence to reduce the level shift absolute value |ΔVd| of the pixel potential Vd near the center. Thus, due to a combination of the influence from the voltage waveform Vg(i, j) in the scanning signal line G(j) and the influence from the potential waveform Vcs(i, j) in the common electrode line CS(j) as described, the potential Vd (i, j) of the pixel electrode 103 changes as shown in FIG. 13-(A), depending on the location on the scanning signal line G(j), causing a level of nonuniformity in the level shift ΔVd, reflecting the change shown in FIG. 13-(A).

The present embodiment takes care of the above-described nonuniformity of the pixel potential Vd (i, j) or the level shift ΔVd, by forming each pixel circuit P(i, j) so that the parasitic capacity Cgd between the scanning signal line and the pixel electrode (between the gate electrode and the drain electrode of the TFT 102) in each pixel circuit P(i, j) will be different in accordance with the location on the scanning signal line G(j). Specifically, each pixel circuit P(i, j) is formed in such a way that the parasitic capacity Cgd or the correction amount ACgd will be substantially equal to |ΔQd/Vgpp|. More accurately, values of the parasitic capacity Cgd are adjusted by means of simulations, for example, so that (Vgpp·Cgd+ΔQd)/Cpix will be constant. This means that the parasitic capacity Cgd will increase as the distance from the inputting end of the scanning signal line G(j) increases, attains a maximum value (peaks off) in the center portion, and then decreases as the distance from the center portion increases toward the terminating end; however, the parasitic capacity Cgd (N, j) near the terminating end does not decrease as low as the parasitic capacity (1, j) near the inputting end. Thus, each pixel circuit P(i, j) is formed so that its parasitic capacity Cgd will be larger as the circuit becomes electrically farther away from the scanning signal line drive circuit 300 and as the circuit becomes electrically farther away from the common electrode line drive circuits CS. As a result, as shown in FIG. 13-(C), it becomes possible that in all pixel circuits P(i, j), the potential Vd (i, j) of the pixel electrode 103 and its level shift ΔVd have substantially the same values regardless of the location on the scanning signal line G(j) (the location in the TFT substrate 100), i.e. making possible to uniformalize the distribution of level shift ΔVd. It should be appreciated that the parasitic capacity Cgd can be changed in accordance with its location on the scanning signal line G(j) by changing the overlap area between the scanning signal line G(j) and the pixel electrode 103 and/or the overlap area between the scanning signal line G(j) and the drain electrode of the TFT 102. In more specific words, the method disclosed in Patent Document 4 (Japanese Patent Laid-Open Hei 11-84428 Gazette) can be utilized.

According to the present embodiment as described, non-uniformity of the level shift ΔVd is eliminated or reduced in a TFT substrate 100, which serves as an active matrix substrate, where common electrode lines CS(j) are formed in parallel to scanning signal lines G(j) and a common electrode potential Vcs is applied from two ends of each common electrode line CS(j), due to the arrangement that the pixel circuits P(i, j) are so formed that the parasitic capacity Cgd will be different in accordance with the location on the scanning signal line G(j) correspondingly to the distribution of pixel potential Vd or of the level shift ΔVd. Thus, it is possible to provide high-quality images with reduced flickers etc. in a liquid crystal display device which uses a TFT substrate according to the present embodiment.

3. Third Embodiment

Next, description will be made for a liquid crystal display device which makes use of a TFT substrate as an active matrix substrate according to a third embodiment of the present invention. The liquid crystal display device includes a TFT substrate 100 which has generally the same configuration as the one used in the second embodiment, or specifically the TFT substrate 100 shown in FIG. 9, differing only in some details (such as the value of parasitic capacity Cgd). Further, this liquid crystal display device has basically the same overall configuration as shown also in FIG. 9, so the same or corresponding elements will be indicated by the same reference symbols, and no details will be given hereinafter. However, the present liquid crystal display device uses a scanning signal line drive circuit 300 which has a different configuration (details to be described later) from that used in the liquid crystal display device which includes a TFT substrate 100 according to the second embodiment.

Again, in the present embodiment, each pixel circuit P(i, j) is the same as the pixel circuit P(i, j) in the second embodiment, and has the circuit configuration as shown in FIG. 10. So, the same elements will be indicated by the same reference symbols, and no details will be given hereinafter. Further, an equivalent circuit diagram of signal propagation paths for the scanning signal and the common electrode signal in the present embodiment is also the same as in the second embodiment, and as shown in FIG. 11.

If the TFT substrate 100 which has the configuration described earlier is driven by the conventional scanning signal line drive circuit, voltage waveforms of the scanning signal Vg(j) will be as shown in FIG. 12-(A), due to the signal propagation delay characteristic of the scanning signal line. On the contrary, according to the present liquid crystal display device, the scanning signal line drive circuit 300 has the configuration disclosed in Patent Document 3 (Japanese Patent Laid-Open Hei 11-281957 Gazette), whereby the scanning signal line drive circuit 300 outputs a scanning signal Vg(j) which has a controlled trailing edge so that the trailing edge of the scanning signal voltage waveform Vg(i, j) in all pixel circuits P(i, j) will have substantially the same gradient.

Figure 14:
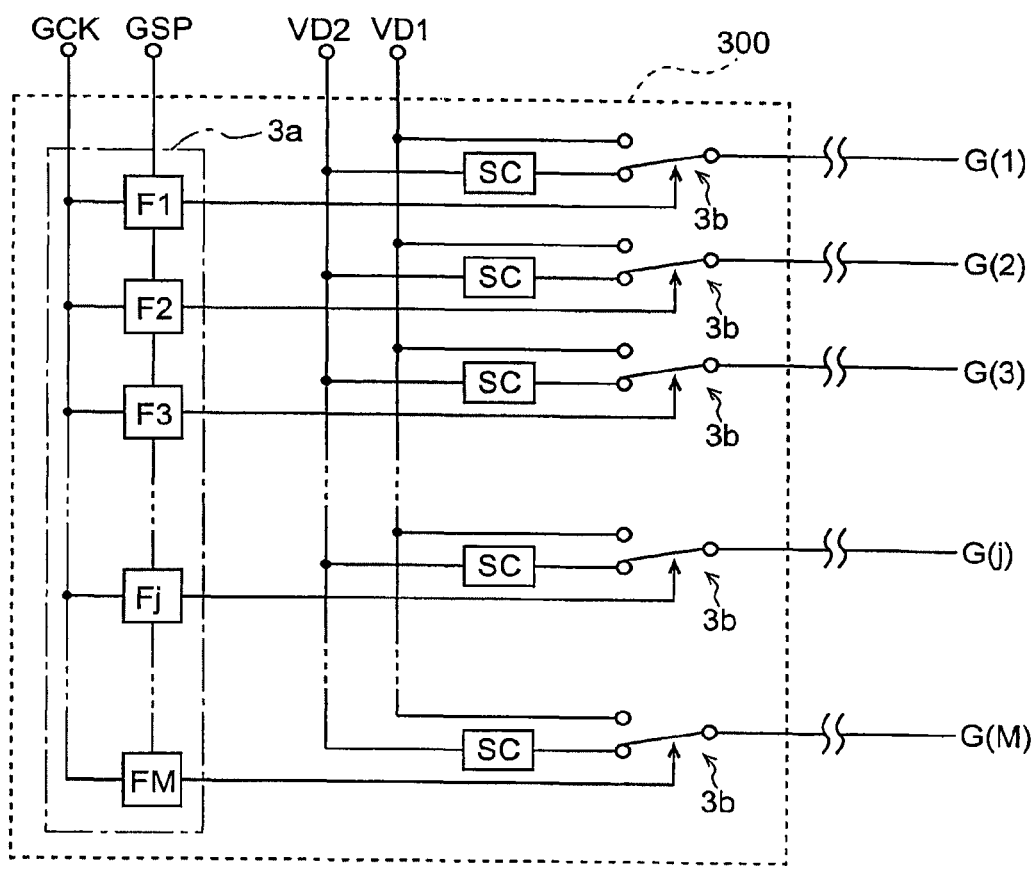
FIG. 14 is a block diagram showing a configuration of a scanning signal line drive circuit in a liquid crystal display device which uses an active matrix substrate according to the third embodiment of the present invention.

FIG. 14 is a block diagram showing the configuration of the scanning signal line drive circuit 300 described above. The scanning signal line drive circuit 300 has a similar configuration to the one in FIG. 3, and operates basically in the same way, including: a shift register section 3a provided by a plurality (M) of cascade-connected flip-flops F(1), F(2) . . . F(j), . . . F(M); and selector switches 3b each changing states in accordance with an output from a corresponding flip-flop. However, as shown in FIG. 14, the scanning signal line drive circuit 300 further includes, in the outputting stage, slew-rate control circuits (gradient control section) SC which are capable of controlling the falling edge gradient of each output of the scanning signal Vg(j). The slew-rate control circuit SC works as an equivalent to an output controlling impedance device which controls the impedance of each output from the scanning signal line drive circuit 300. The output impedance is increased only when each scanning signal Vg(j) falls from the gate-on voltage Vgh to the gate-off voltage Vgl. By proactively deforming the waveform as outputted from the scanning signal line drive circuit 300, differences in the voltage falling speed in the TFT substrate 100 caused by waveform deformation due to the signal propagation delay characteristic of the scanning signal line G(j) (voltage falling speed differences at different locations on the scanning signal line G(j)) are offset.

Figure 15:
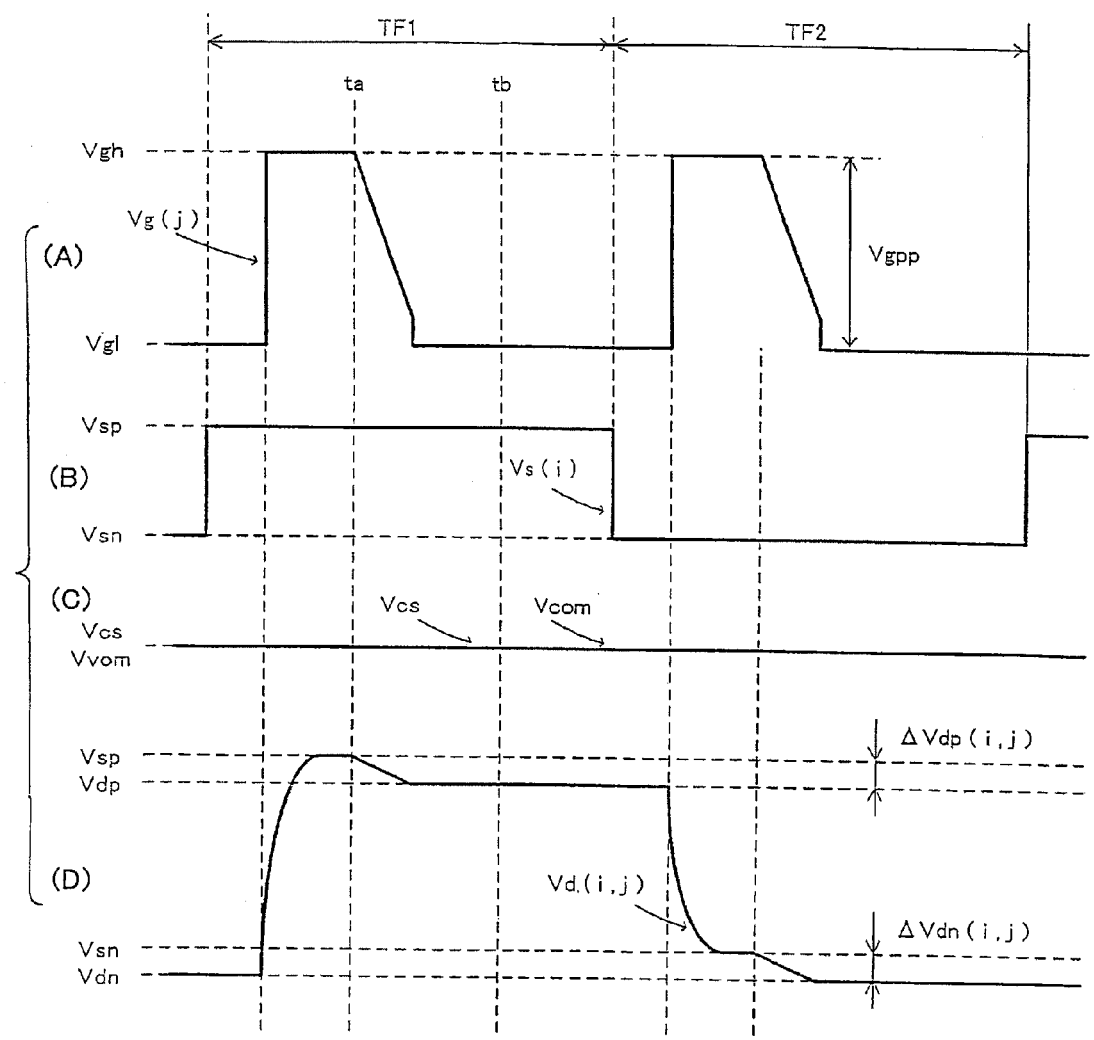
FIG. 15 is a schematically simplified voltage waveform chart of a signal and a pixel potential for driving a TFT substrate according to the third embodiment.

FIG. 15-(A) shows schematically simplified voltage waveforms of the scanning signal Vg(j) applied to the scanning signal line G(j) from the scanning signal line drive circuit 300 which is configured as the above. FIG. 15-(B) shows schematically simplified voltage waveforms of the scanning signal Vs(i) applied to the data signal line S(i) from the data signal line drive circuit 200. FIG. 15-(C) shows schematically simplified voltage waveforms of the common electrode potential Vcs and the opposed-electrode potential Vcom applied to the common electrode line CS(j) and the opposed electrode Ec from the common electrode line drive circuits CS and the opposed electrode drive circuit COM respectively. FIG. 15-(D) shows schematically simplified voltage waveform of the pixel potential Vd (i, j) in the pixel circuit P(i, j) which constitute the TFT substrate 100 according to the present embodiment.

Figure 16:
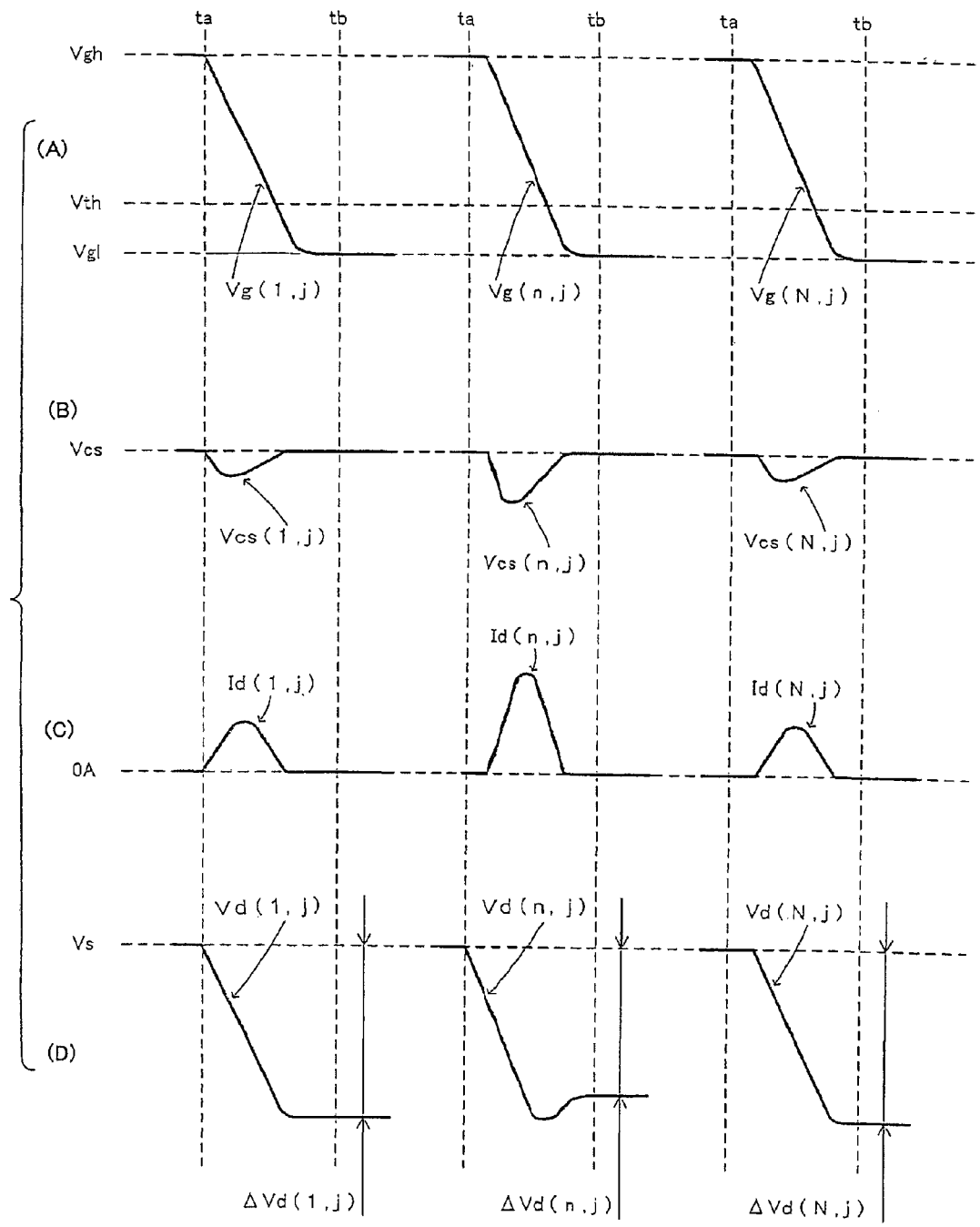
FIG. 16 is a waveform chart showing voltage waveforms and current waveforms in primary portions according to the third embodiment.

FIG. 16-(A) shows precise voltage waveforms in each pixel circuit P(i, j) (specifically, voltage waveforms on different locations on the scanning signal line G(j)) Vg(i, j) of a falling scanning signal Vg(j) outputted from the scanning signal line drive circuit 300 of the configuration described above. FIG. 16-(B) shows precise potential waveforms Vcs(i, j) in a part of common electrode line CS(j) which overlaps the pixel electrode 103 of the pixel circuit P(i, j), (more specifically, potential waveforms when the scanning signal Vg(j) falls from the gate-on voltage Vgh to the gate-off voltage Vgl). FIG. 16-(C) shows precise waveforms of the current which flows through the TFT 102 of pixel circuit P(i, j) at the time when the scanning signal Vg(j) falls from the gate-on voltage Vgh to the gate-off voltage Vgl. FIG. 16-(D) shows precise potential waveforms Vd(i, j) of the pixel electrode 103 in the pixel circuit P(i, j) when the scanning signal Vg(j) falls from the gate-on voltage Vgh to the gate-off voltage Vgl.

As shown in FIG. 10 and FIG. 11, a parasitic capacity is present between the common electrode line CS(j) and the scanning signal line G(j), due to the intervention by the capacity Cgd formed between the scanning signal line and the pixel electrode and the capacity Ccs formed between the pixel electrode and the common electrode line. For this reason, the potential in the common electrode line CS(j) is affected by the voltage waveform Vg(i, j) of the scanning signal in each pixel circuit P(i, j), and further, due to the signal propagation characteristic of the common electrode line CS(j), the potential waveform Vcs(i, j) in the common electrode line CS(j) changes as shown in FIG. 16-(B), depending on the location on the scanning signal line G(j).

Figure 17:
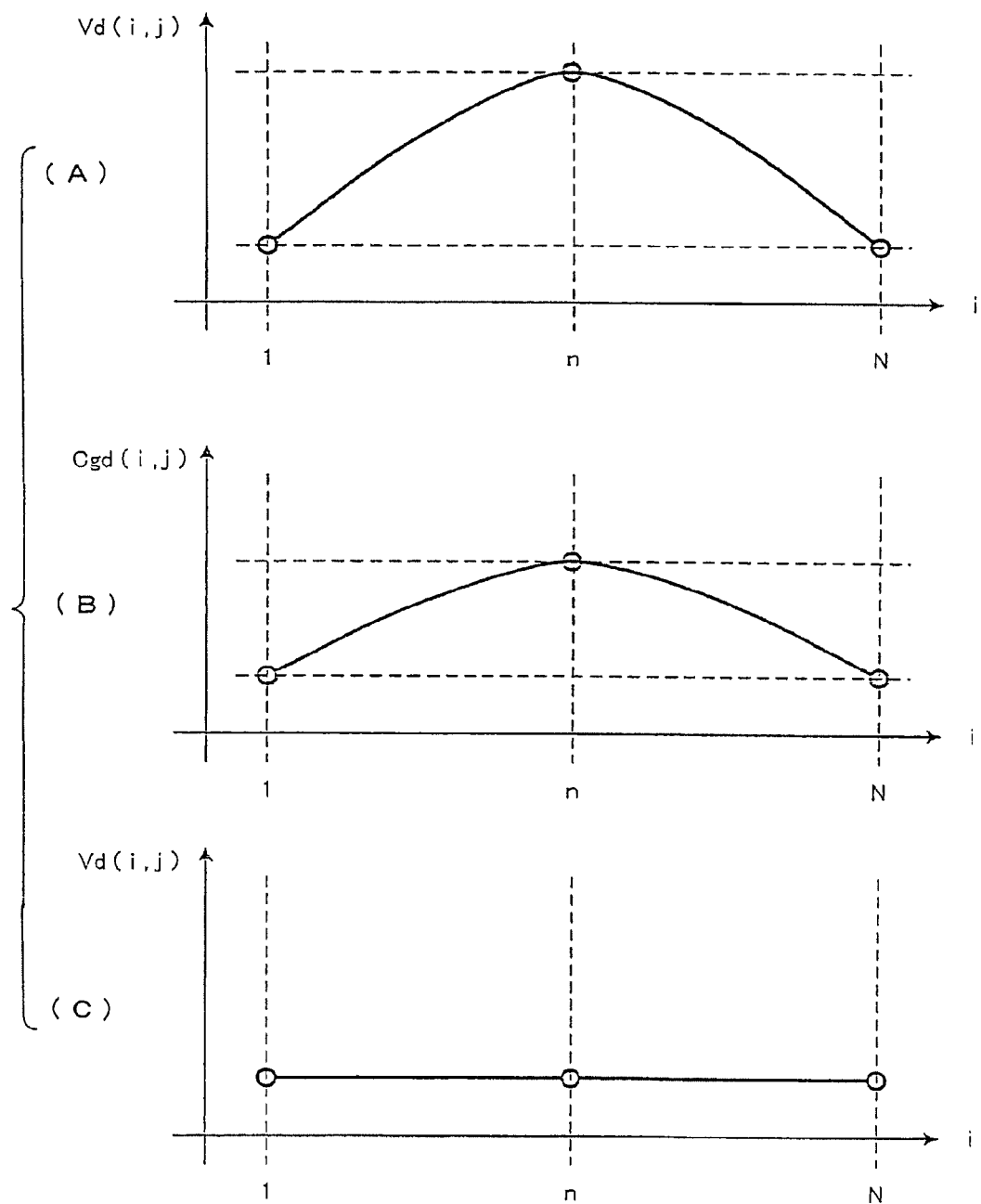
FIG. 17-(A) shows a distribution of pixel potentials before application of the configuration according to the third embodiment.

Because of influences from the Vg(i, j) and the potential waveform Vcs(i, j), as well as TFT characteristic differences (FIGS. 18-(A) and 18-(B)), the waveform Id(i, j) of the current which flows through the TFT 102 during the time when the gate voltage in each TFT 102 is falling from the gate-on voltage Vgh to the gate-off voltage Vgl takes different forms as shown in FIG. 16-(C), depending on its location on the scanning signal line G(j). Thus, the charge amount ΔQd(i, j) which transfers to the pixel electrode 103 via the TFT 102 during the time when the gate voltage in each TFT 102 falls from the gate-on voltage Vgh to the gate-off voltage Vgl takes different values depending on the location on the scanning signal line G(j). Therefore, if all pixel circuits P(i, j) have the same parasitic capacity Cgd between the scanning signal line and the pixel electrode (between the gate electrode and the drain electrode of the TFT 102) as in the conventional TFT substrate 100, the potential waveform Vd(i, j) of the pixel electrode 103 changes as shown in FIG. 16-(D), depending on the location on scanning signal line G(j), due to the differences in charge transfer to the pixel electrodes 103. As a result, even after a sufficient amount of time has passed since the scanning signal Vg(j) fell down to the gate-off voltage Vgl, the level shift ΔVd(i, j) of the potential Vd(i, j) in each pixel electrode is different depending on the location on the scanning signal line G(j), resulting in nonuniformity in the distribution of the level shift ΔVd, due to the differences of the charge amount ΔQd(i, j) based on the equation (5) discussed in the basic study. Specifically, the potential Vd(i, j) of the pixel electrode 103 changes as shown in FIG. 17-(A) depending on the location on the scanning signal line G(j). In more specific words, the potential Vd(i, j) of the pixel electrode 103 increases as the distance from the inputting end (scanning signal line drive circuit 300) increases, attains a maximum value (peaks off) in a center portion, and then decreases as the distance from the center portion increases toward the terminating end. Near the terminating end, the value becomes substantially the same as of pixel potential Vd(1, j) near the inputting end. In response to these, the absolute value |ΔVd| of the level shift in the pixel potential Vd decreases as the distance from the inputting end increases, attains a minimum value near the center, and then increases as the distance from the center portion increases toward the terminating end. Near the terminating end, the value becomes substantially the same as of |ΔVd| near the inputting end.

As described, according to the present embodiment, the pixel potential Vd(N, j) near the terminating end becomes substantially equal to the pixel potential Vd(1, j) near the inputting end, differing from the second embodiment in which the pixel potential Vd(N, j) near the terminating end does not decrease as low as the pixel potential Vd(1, j) near the inputting end (See FIG. 13-(A)). A reason for this is: in the present embodiment, voltage falling of the scanning signal Vg(j) outputted from the scanning signal line drive circuit 300 is controlled, so the falling edge gradient in the voltage waveform Vg(i, j) is substantially the same at all locations on the scanning signal line G(j) (FIG. 16-(A)). This eliminates or reduces influences from the voltage waveform Vg(i, j) in the scanning signal line G(j) to the nonuniformity of the level shift ΔVd, and the nonuniformity of the level shift ΔVd is caused primarily by influences from the potential waveform Vcs(i, j) in the common electrode line CS(j) (and based on the TFT characteristic). It should be appreciated that the potential in the common electrode line CS(j) makes the biggest change at the center portion which is the location electrically farthest from the two common electrode line drive circuits CS connected at two ends of the line (This center portion also represents the center portion of the scanning signal line G(j)). Specifically, potential waveform Vcs(i, j) attains the highest wave height at the center portion.

The present embodiment takes care of the above-described nonuniformity of the pixel potential Vd (i, j) or the level shift ΔVd, by forming each pixel circuit P(i, j) so that the parasitic capacity Cgd between the scanning signal line and the pixel electrode (between the gate electrode and the drain electrode of the TFT 102) in each pixel circuit P(i, j) will change as shown in FIG. 17-(B) in accordance with the location on the scanning signal line G(j). Specifically, each pixel circuit P(i, j) is formed in such a way that the parasitic capacity Cgd or the correction amount ΔCgd will be substantially equal to |ΔQd/Vgpp|. More accurately, values of the parasitic capacity Cgd are adjusted by means of simulations for example so that (Vgpp·Cgd+ΔQd)/Cpix will be constant. This means that the parasitic capacity Cgd will increase as the distance from the inputting end of the scanning signal line G(j) increases, attains a maximum value (peaks off) in the center portion, and then decreases as the distance from the center region increases toward the terminating end, and takes generally the same value as does near the inputting end, in the region near the terminating end. Thus, each pixel circuit P(i, j) is formed so that its parasitic capacity Cgd will be larger as the circuit becomes electrically farther away from the common electrode line drive circuits CS. As a result, as shown in FIG. 17-(C), it becomes possible that in all pixel circuits P(i, j), the potential Vd (i, j) of the pixel electrode 103 and its level shift ΔVd have substantially the same values regardless of the location on the scanning signal line G(j) (the location in the TFT substrate 100). It should be appreciated that the parasitic capacity Cgd can be changed in accordance with its location on the scanning signal line G(j) by changing the overlap area between the scanning signal line G(j) and the pixel electrode 103 and/or the overlap area between the scanning signal line G(j) and the drain electrode of the TFT 102. In more specific words, the method disclosed in Patent Document 4 (Japanese Patent Laid-Open Hei 11-84428 Gazette) can be utilized.

According to the present embodiment as described, nonuniformity of the level shift ΔVd is eliminated or reduced in a TFT substrate 100, which serves as an active matrix substrate, where common electrode lines CS(j) are formed in parallel to scanning, signal lines G(j) and a common electrode potential Vcs is applied from two ends of each common electrode line CS(j), and a voltage waveform Vg(i, j) has a substantially constant falling edge gradient at all locations on each scanning signal line G(j) because of a trailing edge control over the scanning signal Vg(j) outputted from the scanning signal line drive circuit 300. The nonuniformity is eliminated or reduced, due to the arrangement that the pixel circuits P(i, j) are so formed that the parasitic capacity Cgd will be different depending on the location on the scanning signal line G(j) correspondingly to the distribution of pixel potential Vd or of the level shift ΔVd. Thus, it is possible to provide high-quality images with reduced flickers etc. in a liquid crystal display device which uses a TFT substrate according to the present embodiment.

When the voltage falling in the scanning signal Vg(j) outputted from the scanning signal line drive circuit 300 is controlled and the falling edge gradient in the voltage waveform Vg(i, j) is substantially the same at all locations on the scanning signal line G(j) (FIG. 16-(A)), influences from the voltage waveform Vg(i, j) in the scanning signal line G(j) to the nonuniformity of the level shift ΔVd are eliminated or reduced, and the potential Vd (i, j) of the pixel electrode 103 changes as shown in FIG. 17-(A) depending on the location on the scanning signal line G(j). With this situation in mind, according to the present embodiment, each pixel circuit P(i, j) is formed so that the parasitic capacity Cgd between the scanning signal line and the pixel electrode in each pixel circuit P(i, j) will change as shown in FIG. 17-(B) in accordance with the location on the scanning signal line G(j), whereby as shown in FIG. 17-(C), the potential Vd(i, j) of the pixel electrode 103 and its level shift ΔVd have substantially constant values in all pixel circuits P(i, j) regardless of their location on the scanning signal line G(j) (the location in the TFT substrate 100), i.e. making possible to uniformalize the distribution of level shift Vd. However, the falling edge gradient obtained by the above-described control over the falling edge of the scanning signal Vg(j) may result in a situation where the potential Vd (i, j) of the pixel electrode 103 at each location on the scanning signal line G(j) takes a value between the one shown in FIG. 13-(A) and the one shown in FIG. 17-(A). In such a case, each pixel circuit P(i, j) is formed in such a way that the parasitic capacity Cgd between the scanning signal line and the pixel electrode will make an intermediary change between the change pattern in FIG. 13-(B) and the change pattern in FIG. 17-(B) in each pixel circuit P(i, j) in accordance with the location on the scanning signal line G(j), whereby it is possible to make the potential Vd (i, j) of the pixel electrode 103 and its level shift ΔVd have substantially constant values in all pixel circuits P(i, j) as shown in FIG. 13-(C) or FIG. 17-(C), regardless of their location on the scanning signal line G(j).

4. Variation

In each of the above-described embodiments, nonuniformity of the level shift ΔVd is eliminated or reduced by forming the pixel circuits P(i, j) in such a way that the parasitic capacity Cgd will be different in accordance with the location on the scanning signal line G(j) (more specifically, the location in the TFT 100) correspondingly to the distribution of pixel potential Vd or of the level shift ΔVd. However, the present invention is not limited to an arrangement in which the parasitic capacity Cgd is varied in accordance with the location. Alternatively to or together with this, the pixel circuits P(i, j) may be formed so that the TFT characteristic will vary in accordance with the location on the scanning signal line G(j) (location in the TFT substrate 100) correspondingly to the distribution of pixel potential Vd or of the level shift ΔVd, thereby eliminating or reducing the nonuniformity of the level shift ΔVd. In this case, in order to vary the TFT characteristic in accordance with the distribution of level shift ΔVd, formation of each pixel circuit P(i, j) may be made in such a way that a ratio L/W of the channel length L and the channel width W of the TFT 102 will change in accordance with the location on the scanning signal line G(j) (location in the TFT substrate 100). In more specific words, in each of the above embodiment, each pixel circuit P(i, j) or each TFT 102 may be formed in such a way that the ratio L/W will change in virtually the same way as the parasitic capacity Cgd does, in accordance with the location on the scanning signal line G(j) (See FIG. 7-(B), FIG. 13-(B) and FIG. 17-(B)). Specifically, each pixel circuit P(i, j) or each TFT 102 is formed in such a way that the ratio L/W in the TFT 102 will increase as the electrical distance from the scanning signal line drive circuit 300 increases, and as the electrical distance from the common electrode line drive circuit CS increases. Only one of the channel length L and the channel width W may be changed, or both may be changed in combination. In addition, the perimeter length of the source electrode or of the drain electrode, the area of contact between the source electrode and the semiconductor layer, and the area of contact between the drain electrode and the semiconductor layer may also be varied in discretional combination.

Further, arrangements other than those described above also fall in the scope as long as the nonuniformity of the level shift ΔVd is eliminated or reduced by varying an electrical characteristic value of an element in the pixel circuit P(i, j), in accordance with the location on the scanning signal line G(j). For example, out of a plurality of electrostatic capacities which form the pixel capacity Cpix in each pixel circuit P(i, j), at least one other than the parasitic capacity Cgd may be varied in accordance with the location on the scanning signal line G(j). In this case, the varying can be accomplished, for example, by varying the common-electrode capacity (supplemental capacity) Ccs in each pixel circuit P(i, j) in accordance with the location on the scanning signal line G(j). In this case, the common-electrode capacity (supplemental capacity) Ccs is decreased as the distance increases from the common electrode line drive circuits CS (the location where the common electrode potential Vcs is applied to the common electrode line CS(j)). Also, in order that the equation (5) obtained in the basic study will give a substantially constant value for all of the pixel circuits in the TFT substrate (for elimination or reduction of the nonuniformity of level shift ΔVd), only one setting on a parameter such as the TFT characteristic or one of the electrostatic capacities (various electrostatic capacities formed between the pixel electrode and other electrodes) may be changed as was in each of the above-described embodiments; however, a combination of settings on these parameters may be used instead. It should be appreciated to note here that the pixel electrode can mean any of the electrodes which are connected with the pixel electrode 103 while being separated from each signal line by the TFT and the insulation film. Therefore, if the elimination or reduction of the nonuniformity of level shift ΔVd is to be achieved by making a setting on the parasitic capacity Cgd (the electrostatic capacity between the TFT gate electrode and the drain electrode) for each pixel circuit, the arrangement may be that the Cgd at one location in the pixel electrode is varied, or may be that Cgds' at a plurality of locations are varied in combination, or the configuration may be just as described in the above, depending on the presence or absence of a certain Cgd(s). These pixel electrodes may not necessarily be of a low-resistance metal such as Al (aluminum) but may include a high-resistance film such as a semiconductor layer.

According to the embodiments, each pixel circuit P(i, j) is formed in such a way that the parasitic capacity Cgd, L/W of the TFT or others will change smoothly in accordance with the distribution of the pixel potential Vd or the level shift ΔVd, to eliminate or reduce the nonuniformity of the level shift ΔVd (See FIG. 7-(B), FIG. 13-(B) and FIG. 17-(B)); however, the present invention is not limited to this. The change in the parasitic capacity Cgd, L/W of the TFT, and others may be of a stepped pattern, a polygonal line pattern, a nesting pattern or a mosaic pattern, or a combination of these as long as the pattern follows the distribution of the level shift ΔVd. In the light of improved display quality however, an arrangement for smooth change of the parasitic capacity Cgd, TFT L/W, or others is preferable.

According to the second and the third embodiments, the common electrode line is in parallel to the scanning signal line; however, the arrangement may be whatever else as long as a predetermined electrostatic capacity (an equivalent of the common-electrode capacity or the supplemental capacity) is formed between the line and the pixel electrode. Further, the common electrode line may ride on a plurality of scanning signal lines, or a plurality of data signal lines. A plurality of the common electrode lines may be provided per a pixel circuit or per a pixel electrode, or the common electrode line may be provided as a plate. As exemplified, if the common electrode line has a different configuration from those in the second and the third embodiments, the same advantages can be achieved by e.g. forming each pixel circuit in such a way that the parasitic capacity (the electrostatic capacity between the gate electrode and the drain electrode in the TFT) Cgd or the ratio L/W between the channel length L and the channel width W will increase as the distance from the common electrode line drive circuit increases, so that the level shift nonuniformity of the pixel potential is eliminated or reduced. It should be appreciated that the present invention is applicable also to a case in Patent Document 2 (Japanese Patent Laid-Open No. 2001-33758 Gazette) where common electrode lines are divided into a plurality of groups, or to a case such as in line-inversion drive method where the potential in the common electrode line is not constant but fluctuates.

According to each of the embodiments, influence of signal propagation delay in the opposed electrode is assumed to be small enough to be negligible. However, depending on the resistance value and/or the shape of the opposed electrode, influence of signal propagation delay in the opposed electrode cannot be negligible. However, even in such a case, the level shift nonuniformity of the pixel potential can be eliminated or reduced by changing the parasitic capacity Cgd, the ratio L/W of the TFT channel length L and the channel width W or others in accordance to the location, as exemplified in the second and the third embodiments by arrangements to deal with the influences from the signal propagation delay characteristic in the common electrode line.

According to each of the embodiments, the opposed electrode is provided on the opposed substrate which is a different substrate from the TFT substrate, being the other of a pair of substrates that sandwich the liquid crystal, and the liquid crystal is driven by a vertical electric field which is perpendicular to the substrate. There are cases, however, in which the opposed electrode is formed on the same substrate as is the pixel electrode (a case where the opposed electrode is formed on the TFT substrate) or in which the common electrode serves also as the opposed electrode. Even in such cases as the above, where the liquid crystal is driven by a horizontal electric field which is in parallel to the substrate, the present invention is applicable as means for eliminating or reducing level shift in the pixel potential.

In each of the embodiments, description was made by taking a TFT substrate as an example of an active matrix substrate used in a liquid crystal display device. However, the present invention is applicable to other display devices than liquid crystal display devices as long as such a device uses an active matrix substrate provided with a matrix of pixel circuits each including an electrostatic capacity having virtually the same voltage holding capability as the above-described pixel capacity constituted by a pixel electrode and other electrodes, and a thin-film transistor; as well as with scanning signal lines and data signal lines disposed in a grid pattern. For example, the present invention may be applied to an active matrix substrate used in an organic EL (Electro luminescence) display device as means for eliminating or reducing level shift in the holding voltage in the capacity which is equivalent to the pixel capacity which has been discussed so far. In this case, a capacitor which has the above-mentioned electrostatic capacity for holding a voltage that represents a pixel value is provided by: a voltage holding electrode which is connected with the drain electrode of the TFT in the pixel circuit (This voltage holding electrode serves as an equivalent to the pixel electrode thus far discussed); and an electrode of a power source line or of a grounding line which corresponds to the common electrode line thus far discussed. Note, however, that depending on the driving method of the organic EL display device, a second TFT serving as a switching element is placed between the source electrode of the first TFT and the data signal line. Still in another case, a second TFT serving as a switching element and a capacity element (capacitor) connected in series thereto are placed between the source electrode of the first TFT and the data signal line.

Figure 20:
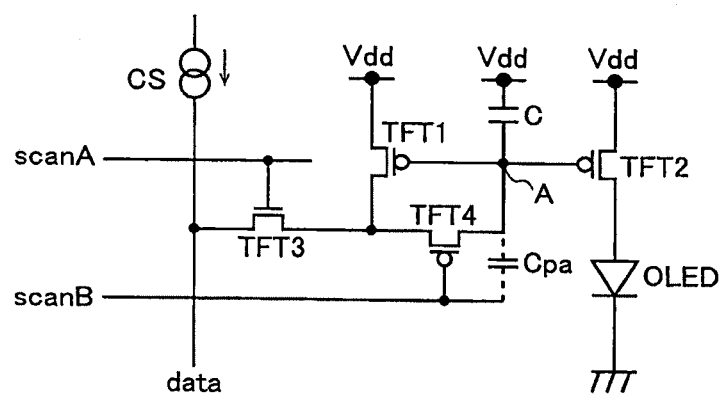
FIG. 20 is a circuit diagram for describing an application of the present invention to an organic EL display device.

For a pixel circuit to be used in an organic EL display device, a configuration as shown in FIG. 20 can be used (See Japanese Patent Laid-Open No. 2001-147659 Gazette). In this pixel circuit, selection of scanning lines scanA and scanB turns ON a TFT 3 and a TFT 4, allowing a current from a current source CS to flow to a TFT 1, and a gate-source voltage which corresponds to the current flowing to the TFT 1 is charged in a holding capacitor C. Thereafter, when the scanning line scan B assumes a non-selected state, a TFT 4 is turned OFF to hold the voltage charged in the holding capacitor C. As for a drive TFT 2, a current in accordance with the charge voltage at the holding capacitor C flows through the drive TFT 2, and this current causes a light emitting element OLED to illuminate. When the TFT 4 changes its state from ON to OFF in this operation, a level shift is caused, just like in the embodiments described earlier, by a parasitic capacity Cpa of the TFT 4. If the level shift varies among the pixel circuits, emission luminance varies and display quality decreases. In such a pixel circuit as this, a portion indicated with a symbol "A" serves as a voltage holding electrode which constitutes a voltage holding capacitor C. A data line "data" is connected with this voltage holding electrode (A) via the TFT 3 and the TFT 4 which serve as switching elements. The TFT 4 is turned ON/OFF by the scanning line scan B. The parasitic capacity Cpa in the TFT 4 corresponds to the parasitic capacity Cgd in the first and the second embodiments which was present in a TFT 102 in the pixel circuit. Therefore, the present invention is also applicable to an active matrix substrate used in organic EL display devices which include pixel circuits of a configuration shown in FIG. 20 to accomplish uniformalization of the level shift within the substrate.

Figure 21:
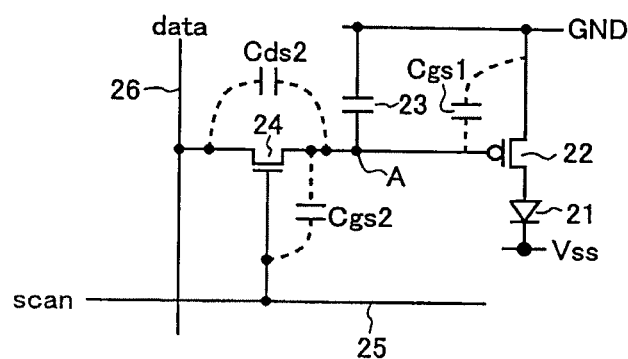
FIG. 21 is a circuit diagram for describing an application of the present invention to an organic EL display device.

Other organic EL display devices use a different configuration in their pixel circuits, such as one exemplified in FIG. 21 (See Japanese Patent Laid-Open No. 2002-156923 Gazette). In this pixel circuit, selection of a scanning line 25 (scan) turns ON a TFT 24, causing a data voltage in a data line 26 "data" to be held in a holding capacity 23(Cs). Thereafter, when the scanning line 25 assumes a non-selected state, the TFT 24 is turned OFF, the data voltage held in the holding capacity 23 is maintained, and a current in accordance with the voltage flows through the drive TFT 22, and this current causes an organic EL device 21 to illuminate. However, when the TFT 24 changes its state from ON to OFF, a level shift is caused like in the embodiments described above, due to a parasitic capacity Cg2 in the TFT 4. If the level shift varies among the pixel circuits, emission luminance varies and display quality decreases. In such a pixel circuit as this, a portion indicated with a symbol "A" serves as a voltage holding electrode which constitutes a voltage holding capacity 23. The data line 26 is connected with this voltage holding electrode (A) via the TFT 24. The TFT 24 is turned ON/OFF by the scanning line 25. The parasitic capacity Cgs2 in the TFT 24 corresponds to the parasitic capacity Cgd in the first and the second embodiments which was present in a TFT 102 in the pixel circuit. Therefore, the present invention is also applicable to an active matrix substrate used in organic EL display devices which include pixel circuits of the configuration shown in FIG. 21, to accomplish uniformalization of the level shift within the substrate.

As in each embodiment described above, an active matrix substrate used in a liquid crystal display device is driven in AC. However, the present invention is also applicable to cases where the drive is performed in DC, such as in an active matrix substrate used in organic EL display devices.

It should be appreciated that according to each of the embodiments, the drive circuit (such as the data signal line drive circuit 200 and the scanning signal line drive circuit 300) for driving the TFT substrate 100 as an active matrix substrate is provided as a separate component manufactured independently from the TFT substrate 100. Alternatively, the drive circuit may be formed on the TFT substrate 100 (The active matrix substrate may be of a driver-monolithic type). As a further note, the pixel capacity Cpix in each pixel circuit in the embodiments is expressed as Cpix=Cgd+Ccs+Clc. However, in case where other parasitic capacities are not negligible, pixel capacity Cpix may include those parasitic capacities. Further, if an active matrix substrate according to the present invention is formed with common electrode lines, the potential Vcs in the common electrode line and the potential Vcom in the opposed electrode may not necessarily be equal to each other. Still further, in the second and the third embodiments, the common electrode line is formed individually from the scanning signal line; alternatively, the common electrode line in each pixel circuit may also serve as the scanning signal line for an adjacent pixel circuit.

INDUSTRIAL APPLICABILITY

The present invention is for application to an active matrix substrate or a drive circuit therefor used in display devices, sensors, etc., and particularly suitable to active matrix substrates for liquid crystal display devices and EL display devices.

The invention claimed is:

1. An active matrix substrate comprising:
data signal lines each for one of data signals;
scanning signal lines crossing with the data signal lines;
a matrix of pixel circuits each corresponding to one of intersections made by the data signal lines and the scanning signal lines;
wherein each pixel circuit includes:
a field-effect transistor having: a source electrode connected with one of the data signal lines that passes through a corresponding one of the intersections, directly or via a predetermined switching element and/or a capacity element; and a gate electrode connected with one of the scanning signal lines that passes through the corresponding intersection; and a voltage holding electrode connected with a drain electrode of the field-effect transistor, providing a predetermined voltage holding capacitor; and wherein an electrostatic capacity Cgd between the gate electrode and the drain electrode in the field-effect transistor increases whereas a rate of the increase of the electrostatic capacity Cgd decreases with an increasing electrical distance from a location of signal application for driving the scanning signal line which passes through the corresponding intersection.

2. A drive circuit for the active matrix substrate according to claim 1, comprising:

a scanning signal line drive circuit for selectively driving the scanning signal by applying predetermined scanning signals respectively to the scanning signal lines, wherein the scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

3. The drive circuit according to claim 2, wherein the scanning signal line drive circuit controls the speed of electric potential change of the scanning signals to be outputted from the scanning signal line drive circuit, based on a signal propagation delay characteristic of the scanning signal lines, so that the speed of electric potential change will be substantially equal regardless of the location on the scanning signal lines.

4. A display device comprising the active matrix substrate according to claim 1 and a drive circuit for driving the active matrix substrate.

5. An active matrix substrate comprising:

data signal lines each for one of data signals;

scanning signal lines crossing with the data signal lines; and a matrix of pixel circuits each corresponding to one of intersections made by the data signal lines and the scanning signal lines;

wherein each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor; and wherein an area of overlap between the electrode constituting the scanning signal line that passes through the corresponding intersection and the voltage holding electrode or the drain electrode of the field-effect transistor increases whereas a rate of the increase of the area decreases with an increasing electrical distance from a location of signal application for driving the scanning signal line which passes through the corresponding intersection.

6. A drive circuit for the active matrix substrate according to claim 5, comprising:

a scanning signal line drive circuit for selectively driving the scanning signal by applying predetermined scanning signals respectively to the scanning signal lines, wherein the scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

7. The drive circuit according to claim 6, wherein the scanning signal line drive circuit controls the speed of electric potential change of the scanning signals to be outputted from the scanning signal line drive circuit, based on a signal propagation delay characteristic of the scanning signal lines, so that the speed of electric potential change will be substantially equal regardless of the location on the scanning signal lines.

8. A display device comprising the active matrix substrate according to claim 5 and a drive circuit for driving the active matrix substrate.

9. An active matrix substrate comprising:

data signal lines each for one of data signals;

scanning signal lines crossing with the data signal lines;

a matrix of pixel circuits each corresponding to one of intersections made by the data signal lines and the scanning signal lines;

wherein each pixel circuit includes:

a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor; and wherein a ratio L/W between a channel length L and a channel width W in the field-effect transistor increases whereas a rate of the increase in the ratio L/W decreases with an increasing electrical distance from a location of signal application for driving the scanning signal line which passes through the corresponding intersection.

10. A drive circuit for the active matrix substrate according to claim 9, comprising:

a scanning signal line drive circuit for selectively driving the scanning signal by applying predetermined scanning signals respectively to the scanning signal lines, wherein the scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

11. The drive circuit according to claim 10, wherein the scanning signal line drive circuit controls the speed of electric potential change of the scanning signals to be outputted from the scanning signal line drive circuit, based on a signal propagation delay characteristic of the scanning signal lines, so that the speed of electric potential change will be substantially equal regardless of the location on the scanning signal lines.

12. A display device comprising the active matrix substrate according to claim 9 and a drive circuit for driving the active matrix substrate.

13. An active matrix substrate comprising:

data signal lines each for one of data signals;

scanning signal lines crossing with the data signal lines;

a matrix of pixel circuits each corresponding to one of intersections made by the data signal lines and the scanning signal lines;

wherein each pixel circuit includes:
a field-effect transistor having: a source electrode connected with one of the data signal lines that passes through a corresponding one of the intersections, directly or via a predetermined switching element and/or a capacity element; a gate electrode connected with one of the scanning signal lines that passes through the corresponding intersection; and a voltage holding electrode connected with a drain electrode of the field-effect transistor, providing a predetermined voltage holding capacitor; and
wherein at least one of the electrostatic capacities which are formed between the drain electrode of the field-effect transistor or the voltage holding electrode and other electrodes other than the electrostatic capacity Cgd between the gate electrode and the drain electrode of the field-effect transistor decreases while a rate of the decrease of said at least one electrostatic capacity decreases with an increasing electrical distance from a location of signal application for driving the scanning signal line which passes through the corresponding intersection.

14. A drive circuit for the active matrix substrate according to claim 13, comprising:
a scanning signal line drive circuit for selectively driving the scanning signal by applying predetermined scanning signals respectively to the scanning signal lines,
wherein the scanning signal line drive circuit controls a speed of electric potential change when the scanning signals make a transition from a predetermined ON voltage which turns the field-effect transistors into a conductive state to a predetermined OFF voltage which turns the field-effect transistors into a nonconductive state.

15. The drive circuit according to claim 14, wherein the scanning signal line drive circuit controls the speed of electric potential change of the scanning signals to be outputted from the scanning signal line drive circuit, based on a signal propagation delay characteristic of the scanning signal lines, so that the speed of electric potential change will be substantially equal regardless of the location on the scanning signal lines.

16. A display device comprising the active matrix substrate according to claim 13 and a drive circuit for driving the active matrix substrate.

* * * * *